United States Patent
Youn et al.

(10) Patent No.: US 8,659,136 B2
(45) Date of Patent: Feb. 25, 2014

(54) SEMICONDUCTOR MEMORY DEVICE, SEMICONDUCTOR PACKAGE AND SYSTEM HAVING STACK-STRUCTURED SEMICONDUCTOR CHIPS

(75) Inventors: Sunpil Youn, Seoul (KR); Kwanyoung Oh, Suwon-si (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 761 days.

(21) Appl. No.: 12/712,284

(22) Filed: Feb. 25, 2010

(65) Prior Publication Data

US 2011/0156232 A1    Jun. 30, 2011

(30) Foreign Application Priority Data

Dec. 30, 2009    (KR) .................. 10-2009-0134931

(51) Int. Cl.
*H01L 23/48* (2006.01)
(52) U.S. Cl.
USPC ......................................... 257/686; 257/777
(58) Field of Classification Search
USPC .................. 257/678–700, 777–778, E23.085, 257/E23.079
See application file for complete search history.

(56) References Cited

U.S. PATENT DOCUMENTS

2008/0123386 A1 *   5/2008   Kang et al. ..................... 365/63

* cited by examiner

*Primary Examiner* — Cuong Q Nguyen
(74) *Attorney, Agent, or Firm* — Muir Patent Consulting, PLLC

(57) ABSTRACT

A memory module includes a first multichip package including a first master chip and a first plurality of slave chips, and a second multichip package, the second multichip package including a second master chip and a second plurality of slave chips. A first through via passes through the first master chip and electrically connects to the first master chip to provide a supply voltage to the first master chip. A second through via passes through the first master chip without being electrically connected to provide a supply voltage to the first master chip. A first set of additional through vias pass through respective ones of the first plurality of slave chips and electrically connect to the respective ones of the first plurality of slave chips, wherein the second through via and first set of additional through vias are aligned to form a first stack of through vias.

24 Claims, 22 Drawing Sheets

(a)

(b)

(c)

SEMICONDUCTOR MEMORY DEVICE, SEMICONDUCTOR PACKAGE AND SYSTEM HAVING STACK-STRUCTURED SEMICONDUCTOR CHIPS

CROSS-REFERENCE TO RELATED APPLICATIONS

This application claims the benefit of Korean Patent Application No. 10-2009-0134931, filed on Dec. 30, 2009, in the Korean Intellectual Property Office, the disclosure of which is incorporated herein in its entirety by reference.

BACKGROUND

The disclosed embodiments relate to a semiconductor memory device, semiconductor package and system, and more particularly, to a semiconductor memory device, semiconductor package, and system having a plurality of stack-structured semiconductor chips.

Semiconductor memory devices that have come into widespread use as storage devices for electronic systems are increasing in capacity and operating speeds. Various attempts have been made to mount a higher capacity of memory on a smaller area and to run the memory at higher speeds.

For example, in order to increase the capacity of a semiconductor memory device, a plurality of semiconductor chips each having a memory cell are stacked within one semiconductor memory device. In general, when a plurality of semiconductor chips are included in a semiconductor memory device, one of the semiconductor chips acts as a master chip and the other semiconductor chips act as slave chips. The master chip exchanges data with an external memory controller or receives various control signals and voltage signals from the external memory controller. To this end, the master chip includes a peripheral region for controlling memory operations by using various control signals and voltage signals received from external sources, providing read data to external devices, or receiving write data from external sources. Also, each of the slave chips includes a pad region that interfaces with the master chip in order to receive various control signals or write data from the master chip or in order to provide read data to the master chip.

The semiconductor memory device is fabricated in the form of a package, and the semiconductor package is mounted on the memory module or system board and may communicate with the external memory controller via conductive devices, e.g., solder balls or leads, which are attached to an external surface of the memory package. Also, in general, a supply voltage and a ground voltage that are used for memory operations are applied to each of the semiconductor chips from the external memory controller via the conductive devices.

When the supply or ground voltage is applied to the memory package, then the supply or ground voltage is transferred to each of the semiconductor chips via a conductive line formed in the semiconductor memory device. In this case, resistance occurs in a path in which such a voltage signal is applied, caused by the physical properties of the conductive line. If higher resistance occurs in this path, the intensity of noise generated in the supply or ground voltage transferred to each of the semiconductor chips also increases. If a high intensity of noise occurs in the supply or ground voltage applied inside a region having a memory cell, memory operating characteristics are degraded. In particular, even if a low intensity of noise is generated in the supply or ground voltage applied to a semiconductor memory device in which a plurality of semiconductor chips are mounted on a small area, then not only the memory characteristics of the semiconductor memory device may be degraded greatly but also the performance of the plurality of semiconductor chips may be degraded.

SUMMARY

In one embodiment, a memory module is disclosed. The memory module includes a first multichip package, the first multichip package including a first master chip and a first plurality of slave chips, and a second multichip package, the second multichip package including a second master chip and a second plurality of slave chips. The memory module further includes a first through via, the first through via passing through the first master chip and electrically connected to the first master chip to provide a supply voltage to the first master chip; a second through via, the second through via passing through the first master chip without being electrically connected to provide a supply voltage to the first master chip; and a first set of additional through vias, each additional through via passing through a respective one of the first plurality of slave chips and electrically connected to the respective one of the first plurality of slave chips, wherein the second through via and first set of additional through vias are aligned to form a first stack of through vias. The memory module additionally includes a third through via, the third through via passing through the second master chip and electrically connected to the second master chip to provide the supply voltage to the second master chip; a fourth through via, the fourth through via passing through the second master chip without being electrically connected to provide a supply voltage to the second master chip; and a second set of additional through vias, each additional through via passing through a respective one of the second plurality of slave chips and electrically connected to the respective one of the second plurality of slave chips, wherein the fourth through via and second set of additional through vias are aligned to form a second stack of through vias. The memory module further includes a first port electrically connected to the first and third through vias for providing the supply voltage to the first master chip and the second master chip, and a second port electrically connected to the first and second stacks for providing the supply voltage to the first plurality of slave chips and the second plurality of slave chips.

In another embodiment, another memory module is disclosed. The memory module includes a first multichip package, the first multichip package including a first substrate and a first stack of chips including a first chip and a plurality of second chips, wherein the first chip is located between the substrate and the plurality of second chips, and a second multichip package, the second multichip package including a second substrate and a second stack of chips including a first chip and a plurality of second chips, wherein the first chip is located between the substrate and the plurality of second chips. The memory module additionally includes a first electrical path in the first multichip package for providing a supply voltage to the first chip of the first stack of chips, the first electrical path comprising a first through via that passes through the first chip of the first stack of chips; and a second electrical path in the first multichip package for providing a supply voltage to the plurality of second chips of the first stack of chips, the second electrical path comprising a first stack of aligned through vias that pass through the first chip of the first stack of chips and the plurality of second chips of the first stack of chips, wherein the second electrical path is electrically isolated from the first chip of the first stack of chips. The memory module further includes a third electrical path in the second multichip package for providing a supply voltage to the first chip of the second stack of chips, the third electrical path comprising a second through via that passes through the first chip of the second stack of chips; and a fourth electrical path in the second multichip package for providing a supply voltage to the plurality of second chips of the second stack of chips, the fourth electrical path comprising a second stack of aligned through vias that pass through the first chip of the second stack of chips and the second chips of the first stack of chips, wherein the fourth electrical path is electrically isolated from the first chip of the second stack of chips. The memory module also includes a first port electrically connected to the first and third electrical paths for providing the supply voltage through the first and third electrical paths, and a second port electrically connected to the second and fourth electrical paths for providing the supply voltage through the second and fourth electrical paths.

In another embodiment, a module is disclosed. The module includes a first multichip package, the first multichip package including a first substrate and a first stack of chips including a first chip and a plurality of second chips, wherein the first chip is between the substrate and the plurality of second chips. The module further includes a second multichip package, the second multichip package including a second substrate and a second stack of chips including a first chip and a plurality of second chips, wherein the first chip is between the substrate and the plurality of second chips. The module additionally includes a first dedicated electrical path in the first multichip package for providing a supply voltage to the first chip of the first stack of chips, the first dedicated electrical path being dedicated to the first chip of the first stack of chip; and a second dedicated electrical path in the first multichip package for providing a supply voltage to the plurality of second chips of the first stack of chips, wherein the second dedicated electrical path is dedicated to the plurality of second chips of the first stack of chips and comprises a first set of through vias including a first through via passing through the first chip of the first stack of chips and a plurality of second through vias passing through the plurality of respective second chips of the first stack of chips, the first through via and plurality of second through vias aligned in a first through via stack. The module further includes a third dedicated electrical path in the second multichip package for providing a supply voltage to the first chip of the second stack of chips, the third dedicated electrical path being dedicated to the first chip of the second stack of chips; and a fourth dedicated electrical path in the second multichip package for providing a supply voltage to the plurality of second chips of the second stack of chips, wherein the fourth dedicated electrical path is dedicated to the plurality of second chips of the second stack of chips and comprises a second set of through vias including a third through via passing through the first chip of the second stack of chips and a plurality of fourth through vias passing through the plurality of respective second chips of the second stack of chips, the third through via and plurality of fourth through vias aligned in a second through via stack. The module further includes a first node electrically connected to the first and third dedicated electrical paths for providing a supply voltage to the first and third dedicated electrical paths, and a second node electrically connected to the second and fourth dedicated electrical paths for providing a supply voltage to the second and fourth dedicated electrical paths.

In a further embodiment, a multichip package is disclosed. The multichip package includes a substrate and a stack of chips including a first chip and a plurality of second chips, wherein the first chip is located between the substrate and the plurality of second chips. The multichip package further includes a first electrical path in the multichip package for providing a first supply voltage to at least an addressing portion of the first chip, a second electrical path in the multichip package for providing a second supply voltage to a data input/output unit of the first chip, so that the second electrical path is dedicated to the data input/output unit of the first chip, and a third electrical path in the first multichip package for providing a third supply voltage to the plurality of second chips of the stack of chips, the third electrical path comprising a stack of aligned through vias that pass through the first chip of the stack of chips and the plurality of second chips of the stack of chips, wherein the third electrical path is dedicated to the plurality of second chips.

BRIEF DESCRIPTION OF THE DRAWINGS

Exemplary embodiments will be more clearly understood from the following detailed description taken in conjunction with the accompanying drawings in which.

It should be noted that these figures are intended to illustrate the general characteristics of methods, structure, and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. The use of similar or identical reference numbers in the various drawings is intended to indicate the presence of a similar or identical element or feature.

DETAILED DESCRIPTION

Example embodiments will now be described more fully hereinafter with reference to the accompanying drawings.

Exemplary embodiments may, however, be embodied in different forms and should not be construed as limited to the embodiments set forth herein.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc., may be used herein to describe various elements, components, regions, and/or sections, these elements, components, regions, and/or sections should not be limited by these terms. These terms are only used to distinguish one element, component, region, or section from another element, component, region, or section. Thus, unless noted otherwise, a first element, component, region, or section discussed below could be termed a second element, component, region, or section without departing from the teachings of example embodiments.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of stated features, integers, steps, operations, elements, and/or components, but do not preclude the presence or addition of one or more other features, integers, steps, operations, elements, components, and/or groups thereof.

Figure 1:
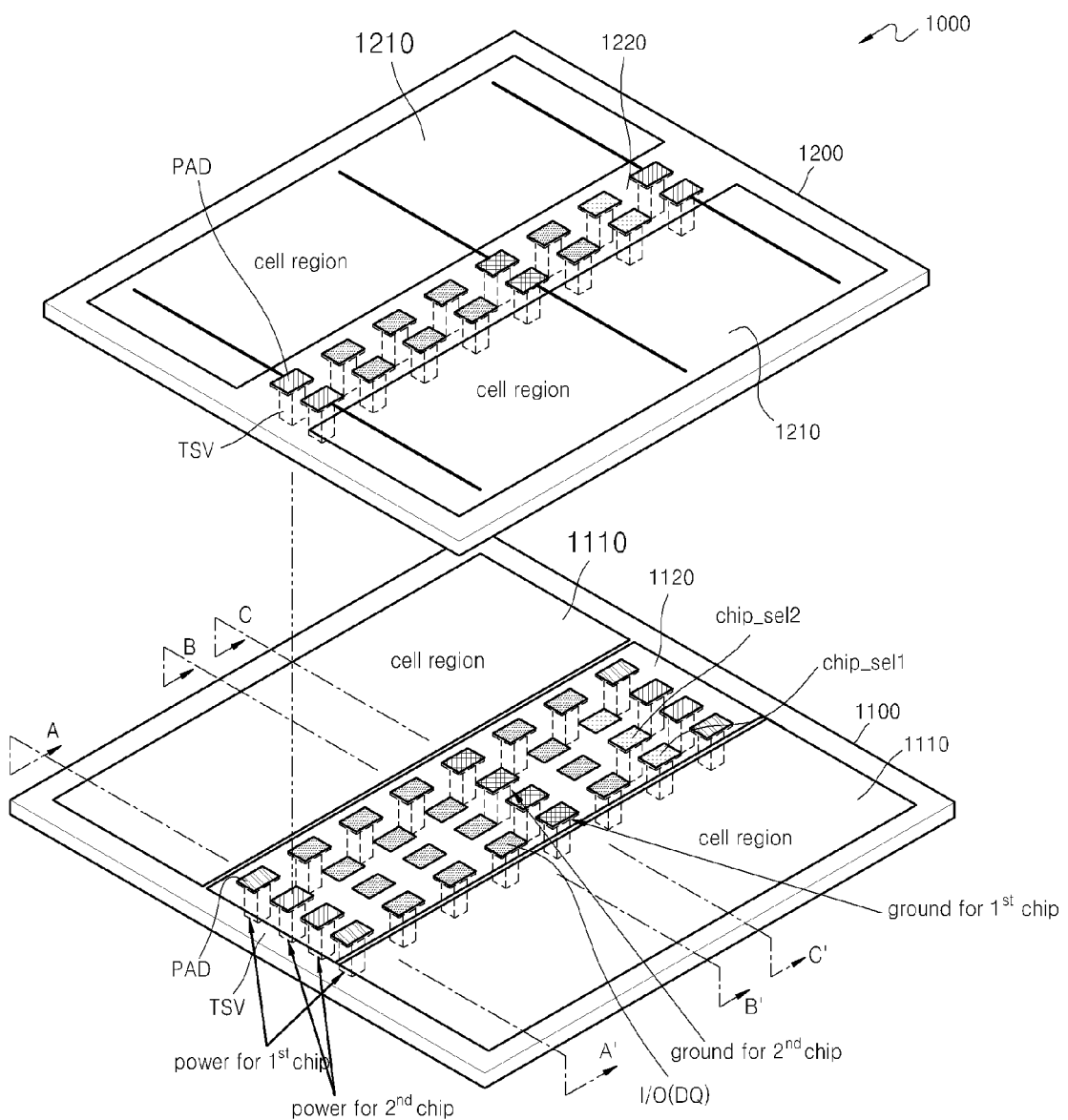
FIG. 1 illustrates an exemplary structure of a semiconductor memory device according to one embodiment.

FIG. 1 illustrates the structure of a semiconductor memory device 1000 according to one embodiment. Referring to FIG. 1, the semiconductor memory device 1000 may include a stacked structure of a plurality of first and second semiconductor chips 1100 and 1120. Although FIG. 1 illustrates that one first semiconductor chip 1100 and one second semiconductor chip 1200 are included in the semiconductor memory device 1000, more than two semiconductor chips may be included in the semiconductor memory device 1000. The first semiconductor chip 1100 acts as a master chip and the second semiconductor chip 1200 acts as a slave chip.

In one embodiment, the second semiconductor chip 1200 may be disposed on the first semiconductor chip 1100 and may be equal to or smaller in size than the first semiconductor chip 1100. When the second semiconductor chip 1200 is disposed on the first semiconductor chip 1100, the thickness of the first semiconductor chip 1100 may be equal or greater than that of the second semiconductor chip 1200. In one embodiment, the first semiconductor chip 1100 as the master chip may include a plurality of memory cells for storing data. However, such memory cells are not necessary. In addition, the first semiconductor chip 1100 may include a control circuit for controlling the memory operation of the semiconductor memory device 1000. For convenience of explanation, it is assumed that the first semiconductor chip 1100 includes a plurality of memory cells.

In one embodiment, the first semiconductor chip 1100 includes a first region 1110 in which the plurality of memory cells are arranged to store data, and a second region 1120 for exchanging a signal with an external memory controller (not shown) and passing signals to other semiconductor chips. On the second region 1120, a plurality of pads PAD are arranged, and a plurality of through-silicon vias TSV are formed to correspond to some of the plurality of pads PAD while passing through the first semiconductor chip 1100. The first semiconductor chip 1100 may communicate with the external memory controller via the plurality of through-silicon vias TSV and may communicate with the second semiconductor chip 1200 via the plurality of pads PAD on the second region 1120. For example, the semiconductor memory device 1000 is fabricated in the form of a package, and the semiconductor package is mounted on a memory module (not shown) and is electrically connected to the external memory controller via conductive devices, e.g., solder balls or leads, which are attached to an external surface of the memory package. A signal received from the memory controller via the conductive devices is supplied to the plurality of through-silicon vias TSV on the second region 1120. Control signals that include addresses and commands, voltage signals, and write data are supplied to the semiconductor memory device 1000 from the external memory controller via the second region 1120, and read data read from a memory cell of the first semiconductor chip 1100 or the second semiconductor chip 1200 is supplied to the external memory controller via the second region 1120.

The second semiconductor chip 1200 includes a third region 1210 having a memory cell for storing data, and a fourth region 1220 for communicating with the first semiconductor chip 1100. On the fourth region 1220, a plurality of pads PAD are formed and a plurality of through-silicon vias TSV are formed to correspond to some of the plurality of pads PAD while passing through the second semiconductor chip 1200 in the vertical direction. The size of the second region 1120 of the first semiconductor chip 1100 may be greater than that of the fourth region 1220 of the second semiconductor chip 1200. The plurality of pads PAD and the plurality of through-silicon vias TSV formed on the fourth region 1220 may be aligned with some of the plurality of pads PAD and the plurality of through-silicon vias TSV formed on the second region 1120, respectively. Thus, all or some of the plurality of through-silicon vias TSV on the fourth region 1220 may be electrically connected to some of the plurality of pads PAD on the second region 1120.

Control signals, a voltage signal, and data received from the external memory controller are supplied to the second region 1120 of the first semiconductor chip 1100. Some of the plurality of vias TSV on the second region 1120 receive the voltage signal and the other vias TSV on the second region 1120 receive the control signals and data. Some of these signals are supplied to the first semiconductor chip 1100 and the other signals are supplied to the second semiconductor chip 1200.

According to one embodiment, a path in which the voltage signal is supplied to the first semiconductor chip 1100 is set to be independent of a path in which the voltage signal is supplied to the second semiconductor chip 1200. For example, a path in which a supply voltage Vdd is applied to the first semiconductor chip 1100 is set to be different from a path in which the supply voltage Vdd is applied to the second semiconductor chip 1200. Likewise, a path in which a ground voltage Vss is applied to the first semiconductor chip 1100 may be set to be different from a path in which the ground voltage Vss is applied to the second semiconductor chip 1200. As such, the paths that supply power to the first semiconductor chip do not overlap with the paths that supply power to the second semiconductor chip, and are thus electrically isolated, dedicated paths.

To this end, the plurality of vias TSV on the second region 1120 include first and second vias TSV to which the supply voltage Vdd is applied from the outside. The supply voltage Vdd applied via the first via TSV is transferred to the inside of the first semiconductor chip 1100, and the supply voltage Vdd applied via the second via TSV are transferred to the inside of the second semiconductor chip 1200. The first and second vias TSV are insulated from each other. The conductive devices attached to the external surface of the memory package may be connected to an external source of the supply voltage Vdd, and the first and second vias TSV may be connected to the conductive devices, respectively, so that the supply voltage Vdd may be applied to the first and second vias TSV. However, the supply voltage Vdd may be applied to both the first semiconductor chip 1100 and the second semiconductor chip 1200 via separate conductive devices. In this case, in the semiconductor memory device 1000, the supply voltage Vdd for the first semiconductor chip 1100 and the supply voltage Vdd for the second semiconductor chip 1200 may be generated individually and may then be applied to the first and second vias TSV, respectively.

The plurality of vias TSV on the fourth region 1220 include a third via TSV. In one embodiment, when the second semiconductor chip 1200 is stacked on the first semiconductor chip 1100, the third via TSV is aligned with the second via TSV. Thus, the supply voltage Vdd applied via the second via TSV is transferred to the inside of the second semiconductor chip 1200 via the third via TSV.

The size of the second region 1120 of the first semiconductor chip 1100 may be greater than that of the fourth region 1220 of the second semiconductor chip 1200. Also, the total number of pads PAD or vias TSV arranged on the second region 1120 may be greater than the total number of pads PAD or vias TSV arranged on the fourth region 1220 in a horizontal direction of the first and second semiconductor chips 1100 and 1200, e.g., a direction A-A'. Thus, some of the plurality of pads PAD or vias TSV on the second region 1120 are aligned with the plurality of pads PAD or vias TSV on the fourth region 1220, respectively. Referring to FIG. 1, if the total number of pads PAD or vias TSV arranged on the second region 1120 is four and the total number of pads PAD or vias TSV arranged on the fourth region 1220 is two in the horizontal direction of the first and second semiconductor chips 1100 and 1200, and the center of the second region 1120 is aligned with that of the fourth region 1220, then the first via TSV may correspond to two pads PAD or vias TSV at the edge of the second region 1120 or may be one of the two pads PAD or vias TSV at the edge of the second region 1120. Also, the second via TSV may correspond to two pads PAD or vias TSV at the center of second region 1120 or may be one of the two pads PAD or one of vias TSV at the center of the second region 1120.

The ground voltage Vss may be applied to the semiconductor memory device 1000 from the external memory controller, as described above. That is, a path in which the ground voltage Vss is applied to the first semiconductor chip 1100 may be insulated from a path in which the ground voltage Vss is applied to the second semiconductor chip 1200. To this end, at least two vias TSV may be disposed on the second region 1120 to receive the ground voltage Vss from the outside, and the ground voltage Vss may be applied to the first semiconductor chip 1100 via some of the at least two vias TSV and may be applied to the second semiconductor chip 1200 via the other via TSV.

On the second region 1120 of the first semiconductor chip 1100, vias may further be arranged to deliver the control signals and data. For example, vias I/O_DQ are arranged on the second region 1120 for data inputting/outputting. Data received via the vias I/O_DQ in the second region 1120 may be either supplied to the external memory controller or may be supplied to the first or second semiconductor chip 1100 or 1200 via an internal circuit included in the second region 1120.

In addition, for example, a chip select signal may be supplied to select at least one of the plurality of semiconductor chips included in the semiconductor memory device 1000. If the memory operation of the semiconductor memory device 1000 is performed in units of memory banks or ranks, then the chip select signal may be supplied only to the first semiconductor chip 1100. If the chip select signal is activated, a write or read operation may be performed on a memory bank or rank selected from among a plurality of memory banks or ranks included in the first and second semiconductor chips 1100 and 1200, and the memory bank or rank may be selected according to a bank selection signal given from the outside.

If the memory operation of the semiconductor memory device 1000 is performed in units of memory chips, then chip select signals may be supplied to the first semiconductor chip 1100 and the second semiconductor chip 1200, respectively. The first and second semiconductor chips 1100 and 1200 may be activated or deactivated according to the states of the corresponding chip select signals. The chip select signals may be supplied to the first semiconductor chip 1100 and the second semiconductor chip 1200 either in the same signal path or in different signal paths, respectively. FIG. 1 illustrates a case where a first chip select signal Chip_sel1 and a second chip select signal Chip_sel2 are supplied to the first semiconductor chip 1100 and the second semiconductor chip 1200 in different signal paths, respectively. To this end, the first chip select signal Chip_sel1 may be supplied to the first semiconductor chip 1100 via the first via TSV on the second region 1120, and the second chip select signal Chip_sel2 may be supplied to the second semiconductor chip 1200 via the second via TSV on the second region 1120 and the third via TSV on the fourth region 1220. The semiconductor memory device 1000 illustrated in FIG. 1 has been described as having the first and second semiconductor chips 1100 and 1120 each having a plurality of memory cells, but the disclosed embodiments are not limited thereto. For example, the semiconductor device of FIG. 1 may be embodied as a logic chip having predetermined circuit arrays or a unit circuit region.

Figure 2A:
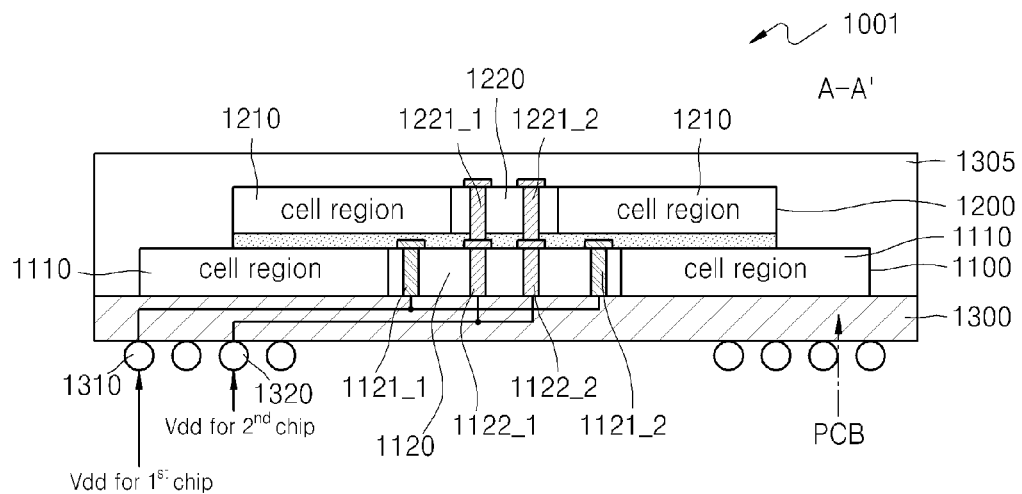
FIGS. 2A to 2C are exemplary cross-sectional views illustrating embodiments of a signal path in a semiconductor package including the semiconductor memory device of FIG. 1.
Figure 2B:
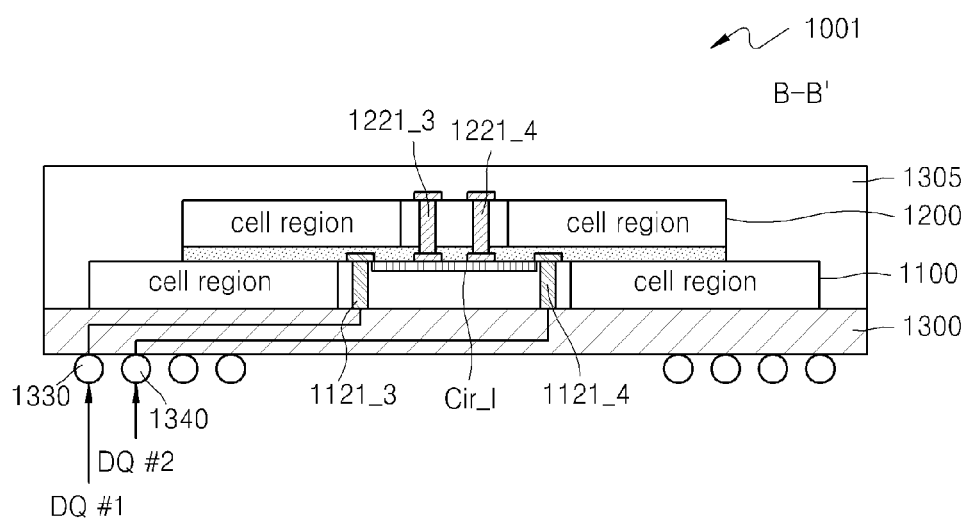
Figure 2C:
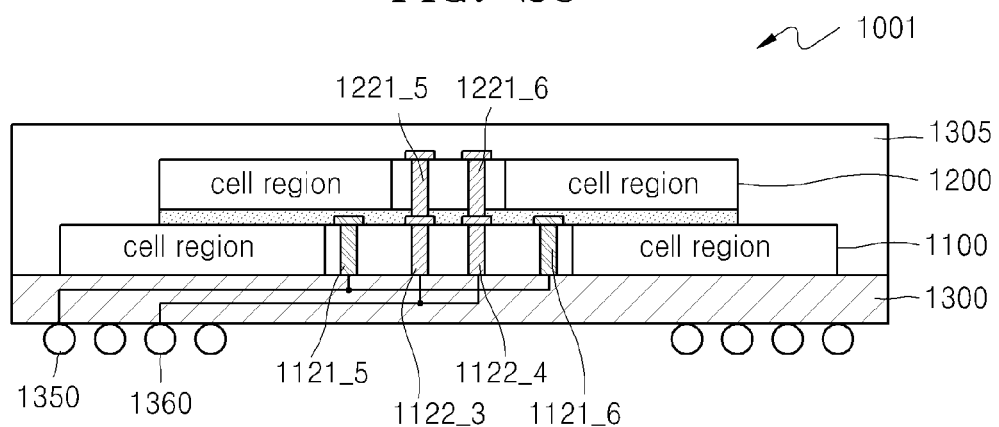

FIGS. 2A to 2C are exemplary cross-sectional views illustrating embodiments of a signal path when the semiconductor memory device 100 of FIG. 1 is fabricated in a semiconductor package. In detail, FIG. 2A is a cross-sectional view taken along the line A-A' of FIG. 1. FIG. 2B is a cross-sectional view taken along the line B-B' of FIG. 1. FIG. 2C is a cross-sectional view taken along the line C-C' of FIG. 1.

Referring to FIG. 2A, the semiconductor package 1001 includes the semiconductor memory device 1000 of FIG. 1, and the semiconductor memory device 1000 includes the first semiconductor chip 1100 as a master chip and the second semiconductor chip 1200 as a slave chip. Although FIG. 2A illustrates only one second semiconductor chip 1200 as a slave chip, a plurality of the second semiconductor chips 1200 may be included as slave chips. The first and second semiconductor chips 1100 and 1200 are stacked sequentially on a package substrate 1300, and conductive devices, e.g., solder balls, are attached onto an external surface of the package substrate 1300 in order to communicate with a memory controller (not shown). Also, a circuit pattern is formed in the package substrate 1300, and a signal via the conductive devices is supplied to the semiconductor chips 1100, 1200. Further, the semiconductor package 1001 may include a molding unit 1305 for molding the semiconductor chips 1100 and 1200 and the package substrate 1300.

The size of the first semiconductor chip 1100 may be greater than that of the second semiconductor chip 1200 since the first semiconductor chip 1100 includes various peripheral circuits for memory operations. Also, in the first semiconductor chip 1100, the size of the second region 1120 on which the various peripheral circuits are disposed may be greater than the size of the fourth region 1220 of the second semiconductor chip 1200. When the second semiconductor chip 1200 is disposed on the first semiconductor chip 1100, the center of the second region 1120 may be aligned with the center of the fourth region 1220. Thus, the first and second semiconductor chips 1100 and 1200 are disposed such that the fourth region 1220 overlaps with the inside of the second region 1120.

From among a plurality of vias on the second region 1120, a supply voltage Vdd is applied to first vias 1121_1 and 1121_2 and second vias 1122_1 and 1122_2 via the solder balls attached to the package substrate 1300. For example, the first vias 1121_1 and 1121_2 are electrically connected to a solder ball 1310 to receive the supply voltage Vdd, and the second vias 1122_1 and 1122_2 are electrically connected to a solder ball 1320 to receive the supply voltage Vdd. The same power source can be connected to both solder balls, or different power sources or at least separate lines (e.g., different lines from separate ports on a controller) can be used to provide Vdd to the two sets of vias. Also, third vias 1222_1 and 1222_2 on the fourth region 1220 are electrically connected to the second vias 1122_1 and 1122_2 via pads on the second region 1120. In one embodiment, those pads on the second region 1120 are electrically isolated from the first chip in that they do not connect electrically to provide power to the first chip.

The supply voltage Vdd applied to the first vias 1121_1 and 1121_2 is transferred to the first region (memory cell region) 1110 along a signal path in the first semiconductor chip 1100, and the supply voltage Vdd applied to the second vias 1122_1 and 1122_2 and the third vias 1222_1 and 1222_2 is transferred to the third region (memory cell region) 1210 along a signal path in the second semiconductor chip 1200. In particular, if the semiconductor chips 1100 and 1200 are stacked as illustrated in FIG. 2A, then a part of the inside of the second region 1120 overlaps with the fourth region 1220. Thus, the first vias 1121_1 and 1121_2 are located outside the overlapping part of the second region 1120 and the second vias 1122_1 and 1122_2 are located inside the overlapping part of the second region 1120. Therefore, the supply voltage Vdd is supplied individually to the first semiconductor chip 1100 and the second semiconductor chip 1200 via different dedicated vias. Meanwhile, although it is not shown in FIG. 2A, each of the semiconductor chips 1100 and 1200 may be a logic chip having a predetermined circuit array or unit circuit region.

Referring to FIG. 2B, the second region 1120 may include vias 1121_3 and 1121_4 for data delivery. The vias 1121_3 and 1121_4 may be electrically connected to solder balls 1330 and 1340 attached to the package substrate 1300. Likewise, the fourth region 1220 may include vias 1221_3, 1221_4 for data delivery, and the vias 1221_3 and 1221_4 may be electrically connected to vias 1221_3 and 1221_4 on the second region 1120 via an internal circuit Cir_I in the second region 1120. For example, in order for data of the first semiconductor chip 1100 to be communicated, a signal path includes the first region 1110, the vias 1221_3 and 1221_4 on the second region 1120, and the solder balls 1330 and 1340. On the other hand, in order for data of the second semiconductor chip 1200 to be communicated, a signal path includes the third region 1210, the vias 1221_3 and 1221_4 on the fourth region 1220, the internal circuit Cir_I, the vias 1221_3 and 1221_4 on the second region 1120, and the solder balls 1330 and 1340.

FIG. 2C illustrates a case where a ground voltage Vss is applied to the first semiconductor chip 1100 and the second semiconductor chip 1200, according to one embodiment. Referring to FIG. 2C, a plurality of vias are formed on the second region 1120 of the first semiconductor chip 1100. For example, on the second region 1120, fourth vias 1121_5 and 1121_6 may be formed to apply the ground voltage Vss to the first semiconductor chip 1100 and fifth vias 1122_3 and 1122_4 may be formed to apply the ground voltage Vss to the second semiconductor chip 1200. Also, on the fourth region 1220, sixth vias 1221_5 and 1221_6 may further be formed to receive the ground voltage Vss while being electrically connected to the fifth vias 1122_3 and 1122_4. As illustrated in FIGS. 2A and 2B, the fourth region 1220 overlaps with a part of the inside of the second region 1120, the fourth vias 1121_5 and 1121_6 may be located outside the overlapping region of the fourth region 1220, and the fifth vias 1122_3 and 1122_4 may be located inside the overlapping part of the fourth region 1220.

The fourth vias 1121_5 and 1121_6 and the fifth vias 1122_3 and 1122_4 may be connected to a source of the ground voltage Vss via different conductive devices attached to the package substrate 1300, respectively. For example, the fourth vias 1121_5 and 1121_6 may be connected to the solder ball 1350 and the fifth vias 1122_3 and 1122_4 may be connected to the solder ball 1360. The ground voltage Vss applied to the fourth vias 1121_5 and 1121_6 is transferred to the first semiconductor chip 1100, and the ground voltage Vss applied to the fifth vias 1122_3 and 1122_4 and the sixth vias 1121_5 and 1121_6 is transferred to the second semiconductor chip 1200. Alternatively, the fourth and fifth vias may be connected to a source of the ground voltage Vss via the same conductive device (e.g., the same solder ball). Regardless of whether the same or separate solder balls are used, the path in which the ground voltage Vss is applied to the first semiconductor chip 1100 may be different from the path in which the ground voltage Vss is applied to the second semiconductor chip 1200.

Figure 3:
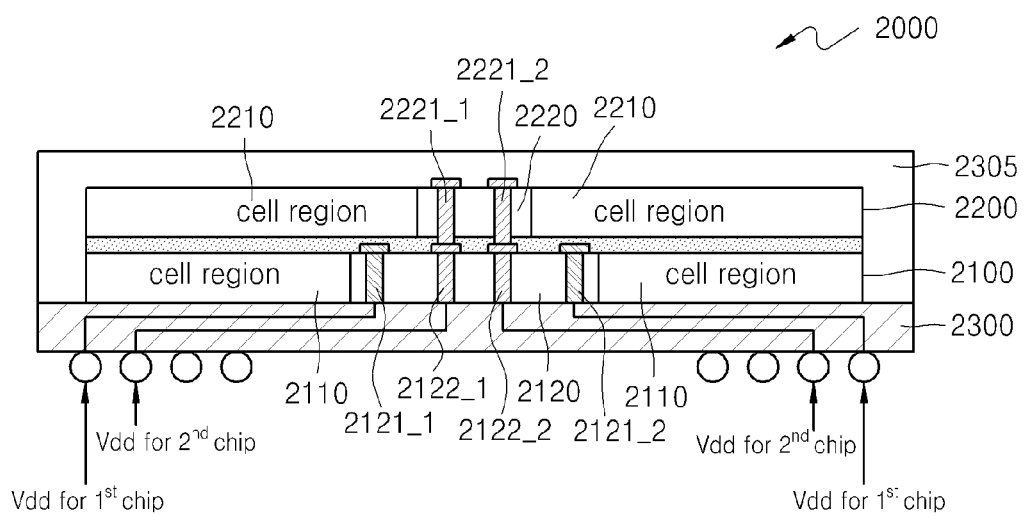
FIG. 3 is an exemplary cross-sectional view of a semiconductor package according to one embodiment.

FIG. 3 is a cross-sectional view of a semiconductor package 2000 according to one embodiment. Referring to FIG. 3, the semiconductor package 2000 includes a master chip and at least one slave chip, the sizes of which are the same.

Referring to FIG. 3, the semiconductor package 2000 includes a first semiconductor chip 2100 as the master chip, and at least one second semiconductor chip 2200 formed as the at least one slave chip on the first semiconductor chip 2100. The first semiconductor chip 2100 and the at least one second semiconductor chip 2200 are disposed on a package substrate 2300, and a plurality of conductive devices, e.g., solder balls, are attached to an external surface of the package substrate 2300 in order to communicate with an external memory controller (not shown). The first semiconductor chip 2100 includes a first region 2110 having a memory cell for storing data, and a second region 2120 in which peripheral circuits, pads, and vias are disposed to drive the memory cell of the first region 2110. The at least one second semiconductor chip 2200 also includes a third region 2210 having a memory cell for storing data, and a fourth region 2220 in which pads and vias are disposed to communicate with the first semiconductor chip 2100 or another second semiconductor chip (not shown). Further, the semiconductor package 2000 may include a molding unit 2305 for molding the semiconductor chips 2100 and 2200 and the package substrate 2300.

Referring to FIG. 3, since the size of the second region 2120 of the first semiconductor chip 2100 is greater than the size of the fourth region 2220 of the at least one second semiconductor chip 2200, the size of the memory cell included in the at least one second semiconductor chip 2200 is greater than the size of the memory cell included in the first semiconductor chip 2100 when the size of the first semiconductor chip 2100 is the same as the size of the at least one second semiconductor chip 2200. Thus, the memory capacity of the semiconductor package 2000 may be greater than those of the semiconductor memory devices 1000 illustrated in FIGS. 2A to 2C, thereby increasing the integration degree thereof. If the second region 2120 is disposed at the center of the first semiconductor chip 2100 and the fourth region 2220 is disposed at the center of the second region 2120, then the center of the fourth region 2220 is aligned with the center of the second region 2120 when the first semiconductor chip 2100 and the at least one second semiconductor chip 2200 are stacked on the package substrate 2300. First vias 2121_1 and 2121_2 for applying a supply voltage Vdd to the first semiconductor chip 2100 may be located outside a part of the fourth region 2220 that overlaps with a second region 2120, and second vias 2122_1 and 2122_2 for applying the supply voltage Vdd to the at least one second semiconductor chip 2200 may be located inside the overlapping part of the fourth region 2220. Third vias 2221_1 and 2221_2 on the fourth region 2220 are electrically connected to the second vias 2122_1 and 2122_2. The third vias 2221_1, 2221_2 receive the supply voltage Vdd via the second vias 2122_1 and 2122_2 and then transfer it to the at least one second semiconductor chip 2200. If the semiconductor package 2000 is shown on a cross-sectional view as illustrated in FIG. 3, the first vias 2121_1 and 2121_2 may be formed at both the edges of second region 2120, respectively, and the second vias 2122_1 and 2122_2 may be disposed between the first vias 2121_1 and 2121_2.

Figure 4:
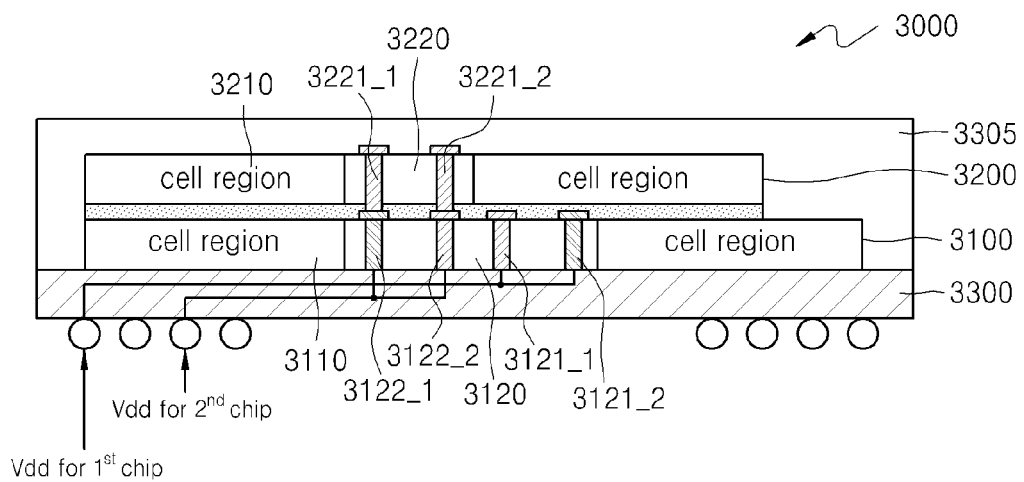
FIG. 4 is an exemplary cross-sectional view of a semiconductor package according to another embodiment.

FIG. 4 is a cross-sectional view of a semiconductor package 3000 according to another embodiment. Referring to FIG. 4, the semiconductor package 3000 includes a master chip and at least one slave chip, the sizes of which are different from each other.

Referring to FIG. 4, the semiconductor package 3000 includes a first semiconductor chip 3100 as the master chip, and at least one second semiconductor chip 3200 formed as the at least one slave chip on the first semiconductor chip 3100. The first semiconductor chip 3100 and the at least one second semiconductor chip 3200 are disposed on a package substrate 3300, and a plurality of conductive devices, e.g., solder balls, are attached to an external surface of the package substrate 3300 in order to communicate with an external memory controller (not shown). The size of a second region 3120 of the first semiconductor chip 3100 is greater than that of a fourth region 3220 of the at least one second semiconductor chip 3200. Further, the semiconductor package 3000 may include a molding unit 3305 for molding the semiconductor chips 3100 and 3200 and the package substrate 3300.

When the second semiconductor chip 3200 is stacked on the first semiconductor chip 3100, an end of the second semiconductor chip 3200 is aligned with an end of the first semiconductor chip 3100. In this case, when the size of a memory cell of the first semiconductor chip 3100 is the same as that of a memory cell of the second semiconductor chip 3200, a first end of the second region 3120 is aligned with a first end of the fourth region 3220, but a second end of the second region 3120 is not aligned with a second first end of the fourth region 3220. Thus, a portion of second region 3120 adjacent to the first end of the second region 3120 overlaps with the fourth region 3220, and a portion of the second region 3120 adjacent to the second end of the second region 3120 does not overlap with the fourth region 3220. When a supply voltage Vdd or a ground voltage Vss is applied to memory cells 3110, and 3210 in the semiconductor package 3000, first vias 3121_1 and 3121_2 are formed on the portion that does not overlap with the fourth region 3220 and second vias 3122_1 and 3122_2 are formed on the portion that overlaps with the fourth region 3220. Third vias 3221_1 and 3221_2 are aligned with the second vias 3122_1 and 3122_2 to be electrically connected to the second vias 3122_1 and 3122_2. Thus, the third vias 3221_1 and 3221_2 receive the supply voltage Vdd or the ground voltage Vss via the second vias 3122_1 and 3122_2 and then transfer it to the second semiconductor chip 3200.

Figure 5A:
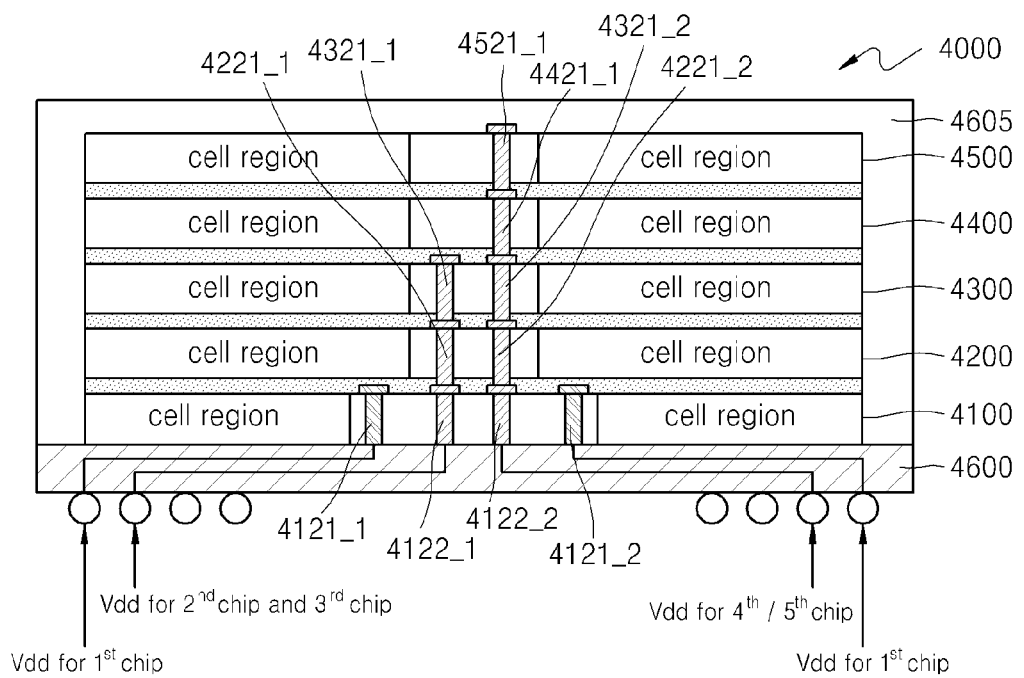
FIGS. 5A to 5C are exemplary cross-sectional views illustrating other embodiments of a semiconductor package.
Figure 5B:
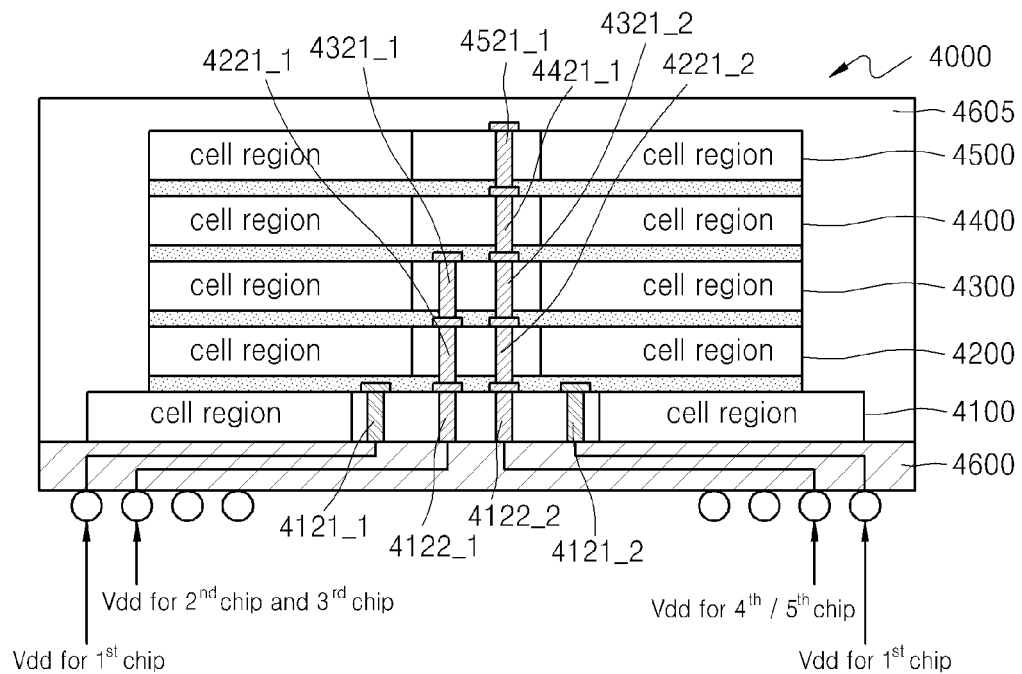
Figure 5C:
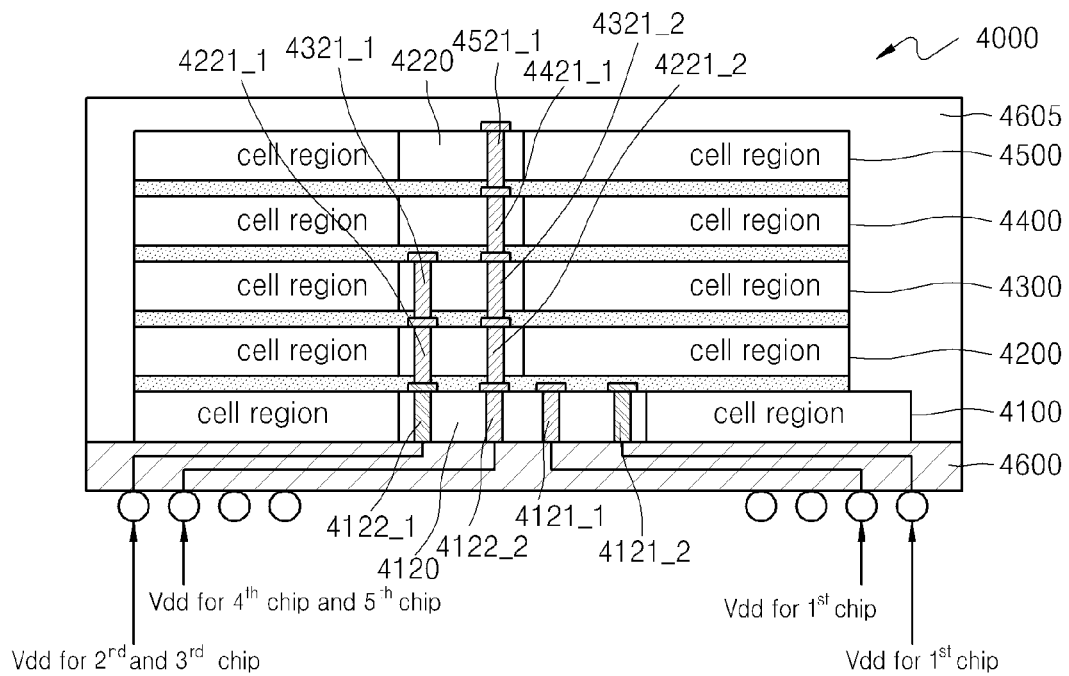

FIGS. 5A to 5C are cross-sectional views illustrating other exemplary embodiments of a semiconductor package 4000. FIGS. 5A to 5C illustrate cases where the semiconductor package 4000 includes a master chip and a plurality of slave chips. In detail, FIG. 5A illustrates a case where a master chip and a plurality of slave chips are the same in size (e.g., same width or area), and FIGS. 5B and 5C illustrate cases where a master chip and a plurality of slave chips are different in size.

Referring to FIG. 5A, the semiconductor package 4000 includes a first semiconductor chip 4100 as a master chip, and a plurality of second semiconductor chips 4200 to 4500 formed as slave chips on the first semiconductor chip 4100. The first semiconductor chip 4100 is disposed on a package substrate 4300, and the plurality of second semiconductor chips 4200 to 4500 are disposed on the first semiconductor chip 4100. A plurality of conductive devices, e.g., solder balls, are attached to an external surface of the package substrate 4300 in order to communicate with an external memory controller (not shown). Further, the semiconductor package 4000 may include a molding unit 4605 for molding the semiconductor chips 4100 to 4500 and the package substrate 4600.

The size of a second region of the first semiconductor chip 4100 is greater than those of fourth regions of the respective second semiconductor chips 4200 to 4500, and the center of the second region is aligned with the centers of the fourth regions. First vias 4121_1 and 4121_2 are disposed at the edges of the second region, respectively, and are electrically connected to the solder balls of the package substrate 4600 in order to receive a supply voltage Vdd that is to be applied to the first semiconductor chip 4100. Second vias 4122_1 and 4122_2 may be disposed inside the second region or between the first vias 4121_1 and 4121_2, and are electrically connected to the solder balls of the package substrate 4600 to receive the supply voltage Vdd that is to be applied to the second semiconductor chips 4200 to 4500. The current embodiment has been described with respect to the application of the supply voltage Vdd but a ground voltage Vss may be applied instead of the supply voltage Vdd.

Each of the second semiconductor chips 4200 to 4500 receives the supply voltage Vdd or the ground voltage Vss along a signal path that is different than in the first semiconductor chip 4100. In particular, the second semiconductor chips 4200 to 4500 may receive the supply voltage Vdd or the ground voltage Vss along either a common signal path or different signal paths. If all the second semiconductor chips 4200 to 4500 receive the supply voltage Vdd or the ground voltage Vss along the common signal path, they may be weak against noise. If the second semiconductor chips 4200 to 4500 receive the supply voltage Vdd or the ground voltage Vss along different signal paths, a plurality of solder balls and a plurality of through-silicon vias need to be formed in the semiconductor package 4000, thus reducing the integration degree thereof. Thus, the second semiconductor chips 4200 to

4500 may be divided into several groups, and the supply voltage Vdd or the ground voltage Vss may be applied in units of the groups along different signal paths.

FIG. 5A illustrates a case where two second semiconductor chips belong to one group and the supply voltage Vdd is thus applied to the group of the second semiconductor chips along a common signal path. For example, in the second semiconductor chips 4200 and 4300, third vias 4221_1 and 4321_1 are electrically connected to a second via 4122_1 and other third vias 4221_2 and 4321_2 are electrically connected to a second via 4122_2. The supply voltage Vdd is applied to the second semiconductor chips 4200 and 4300 only via the third vias 4221_1 and 4321_1. In one embodiment, vias are aligned in a vertical stack in order to create a dedicated signal path for providing supply or ground voltage to one or more slave chips.

Third vias 4421_1 and 4521_1 included in other second semiconductor chips 4400 and 4500 are electrically connected to the second via 4122_2 via the third vias 4221_2 and 4321_2 of the second semiconductor chips 4200 and 4300. The supply voltage Vdd is applied to the second semiconductor chips 4400 and 4500 via the third vias 4421_1 and 4521_1. If more than four second semiconductor chips are included in the semiconductor package 4000, three or more second semiconductor chips may belong to one group or more second and third vias are disposed in order to apply the supply voltage Vdd or the ground voltage Vss to these second semiconductor chips.

Referring to FIG. 5B, in the semiconductor package 4000, the size of a first semiconductor chip 4100 is greater than that of a plurality of second semiconductor chips 4200 to 4500, and the size of a second region of the first semiconductor chip 4100 is greater than those of fourth regions of the respective second semiconductor chips 4200 to 4500. The center of the second region is aligned with the centers of the fourth regions. First vias 4121_1 and 4121_2 are disposed at the edges of the second region, respectively, and second vias 4122_1 and 4122_2 are disposed inside the second region or between the first vias 4121_1 and 4121_2. The third vias 4221_1, 4221_2, 4321_1, 4321_2, 4421_1, and 4521_1 of the second semiconductor chips 4200 and 4300 are aligned with the second via 4122_1 or 4122_2. Further, the semiconductor package 4000 may include a molding unit 4605 for molding the semiconductor chips 4100 to 4500 and the package substrate 4600.

Referring to FIG. 5C, in the semiconductor package 4000, the size of a first semiconductor chip 4100 is greater than those of second semiconductor chips 4200 to 4500, and the size of a second region of the first semiconductor chip 4100 is greater than those of fourth regions of the respective second semiconductor chips 4200 to 4500. One end of each of the second semiconductor chips 4200 to 4500 is aligned with one end of the first semiconductor chip 4100 and one end of the second region 4120 is aligned with one end of each of the fourth regions. First vias 4121_1 and 4121_2 are disposed on a portion of the first region adjacent to the a second end of second region 4120 and not aligned with fourth regions 4220, and second vias 4122_1 and 4122_2 are disposed on a portion of the first region adjacent to the a first end of second region 4120 and aligned with fourth regions 4220. Further, the semiconductor package 4000 may include a molding unit 4605 for molding the semiconductor chips 4100 to 4500 and the package substrate 4600.

Figure 6A:
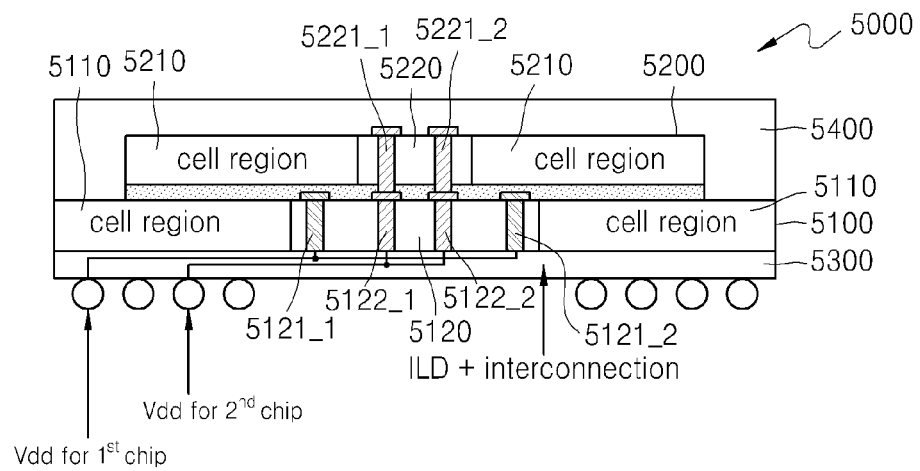
FIGS. 6A and 6B are exemplary cross-sectional views illustrating other embodiments of a semiconductor package.
Figure 6B:
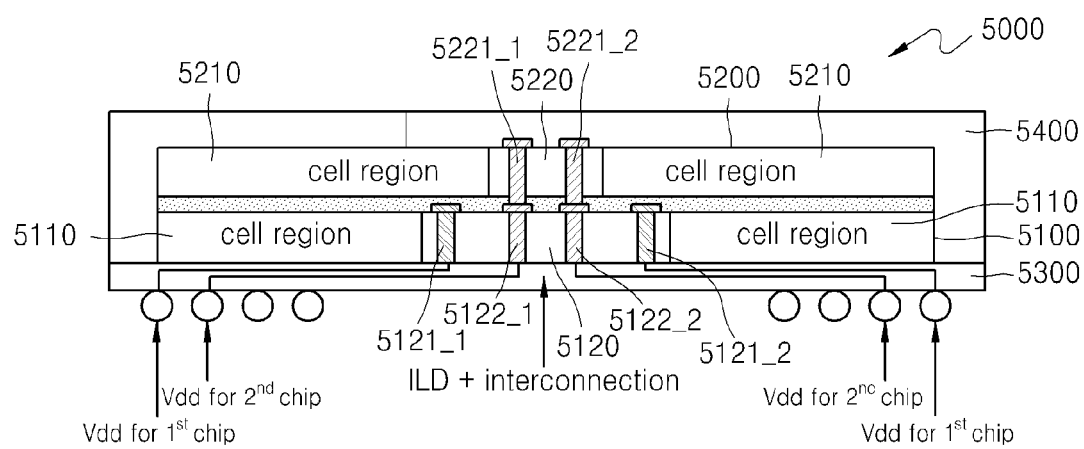

FIGS. 6A and 6B are cross-sectional views illustrating other exemplary embodiments of a semiconductor package 5000. FIGS. 6A and 6B illustrate cases where the semiconductor package 5000 is embodied as a wafer-level package (WLP) without using a package substrate. Also, referring to FIG. 6A, the size of a master chip is different from that of a slave chip, and referring to FIG. 6B, the size of a master chip is the same as that of a slave chip.

When a semiconductor memory device is fabricated in the form of a package, the WLP is fabricated by forming an interconnection layer with a circuit pattern on a wafer having semiconductor chips without using a package substrate and by attaching conductive devices, such as solder balls, to one surface of the interconnection layer. If the semiconductor package 5000 is embodied as a WLP, the size of the semiconductor package 5000 is similar to that of a semiconductor chip, thereby enhancing the integration degree thereof. For example, the size of the semiconductor package 5000 may be 1.2 times less than that of a semiconductor chip package using a package substrate.

Referring to FIG. 6A, the semiconductor package 5000 includes a first semiconductor chip 5100, at least one second semiconductor chip 5200, and an interconnection layer 5300. Similar to the above previous embodiments, the first semiconductor chip 5100 includes a first region 5110 and a second region 5120. A memory cell or a logic circuit is disposed on the first region 5110, and a plurality of pads and vias are disposed on the second region 5120. Also, the at least one second semiconductor chip 5200 includes a third region 5210 and a fourth region 5220. A memory cell array is disposed on the third region 5210, and a plurality of pads and vias are disposed on the fourth region 5220. A ReDistribution (RDL) process may be performed to form the interconnection layer 5300 on a surface of the first semiconductor chip 5100. For example, the pads on the second region 5120 may be connected to solder balls by forming an InterLayer Dielectric (ILD) layer and forming an interconnection in the ILD layer. Although in the current embodiment of FIG. 6A, the center of the second region 5120 is aligned with the center of the fourth region 5220, one end of the second region 5120 may be aligned with one end of the fourth region 5220 as in the above embodiments.

By forming the interconnection layer 5300 according to the RDL process, the first vias 5121_1 and 5121_2 and second vias 5122_1 and 5122_2 on the second region 5120 are connected to solder balls for applying a supply voltage Vdd. The first vias 5121_1 and 5121_2 and the second vias 5122_1, 5122_2 may be connected to different solder balls, respectively. After the first semiconductor chip 5100 is formed on the interconnection layer 5300, the second semiconductor chip 5200 is disposed on the first semiconductor chip 5100, and the third vias 5221_1 and 5221_2 on the fourth region 5220 are connected to the second vias 5122_1 and 5122_2 via the pads. Then, a sawing process is performed to cut a wafer including a plurality of WLPs in order to separate the WLPs from each other, and a molding process is performed to form a molding unit (5400) for protecting the first semiconductor chip 5100 and the at least one second semiconductor chip 5200.

FIG. 6B illustrates a case where the semiconductor package 5000 includes a first semiconductor chip 5100 and at least one second semiconductor chip 5200, the sizes of which are the same. Referring to FIG. 6B, the semiconductor package 5000 includes the first semiconductor chip 5100, the at least one second semiconductor chip 5200, and an interconnection layer 5300. A supply voltage Vdd or a ground voltage Vss may be applied to the first semiconductor chip 5100 via first vias 5121_1 and 5121_2, and may be applied to the at least one second semiconductor chip 5200 via second vias 5122_1 and 5122_2 and third vias 5221_1 and 5221_2. Also, the first vias 5121_1 and 5121_2 and the second vias 5122_1 and 5122_2 are connected to solder balls via the interconnection layer 5300.

Referring to FIG. 6B, if the size of the first semiconductor chip 5100 is the same as that of the at least one second semiconductor chip 5200, a sawing process may be performed only once for a first wafer including a plurality of the first semiconductor chips 5100 and a second wafer including a plurality of the second semiconductor chips 5200. In other words, the sawing process is not performed individually in order to cut the first wafer having a plurality of the first semiconductor chips 5100 and in order to cut the second wafer having a plurality of the second semiconductor chips 5200. That is, the semiconductor package 5000 may be fabricated by forming the interconnection layer 5300 on one surface of the first wafer having a plurality of the first semiconductor chips 5100, disposing the second wafer having a plurality of second semiconductor chips 5200 on another surface of the first wafer, forming the molding layer for protecting the first and second semiconductor chips 5100 and 5200, and then performing the sawing process once on the first and second wafers. In this case, the total number of processes required is reduced, thereby lowering manufacturing costs. Also, if cutting is performed on a location separated a predetermined distance from first ends of the first semiconductor chips 5100 and the second semiconductor chips 5200, then all surfaces of the first and second semiconductor chips 5100 and 5200 are not exposed to the outside and are protected by the molding layer.

FIGS. 7A to 7D are cross-sectional views illustrating exemplary embodiments of a method of fabricating a semiconductor package. FIGS. 7A to 7D illustrate embodiments of a method of fabricating the semiconductor package 5000 illustrated in FIGS. 6A and 6B, but the semiconductor package according to the other disclosed embodiments may also be fabricated as illustrated in or similarly to FIGS. 7A to 7D.

Figure 7A:
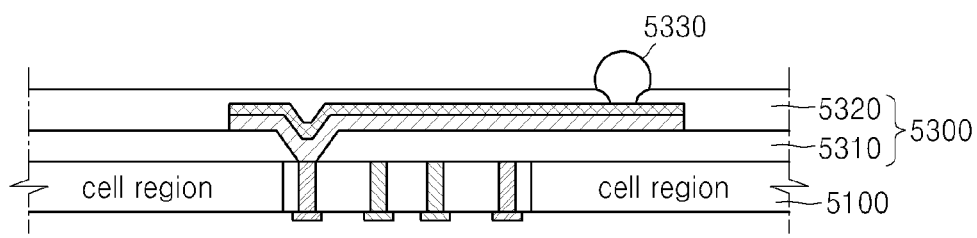
FIGS. 7A to 7D are exemplary views illustrating embodiments of a method of fabricating a semiconductor package.
Figure 7A:
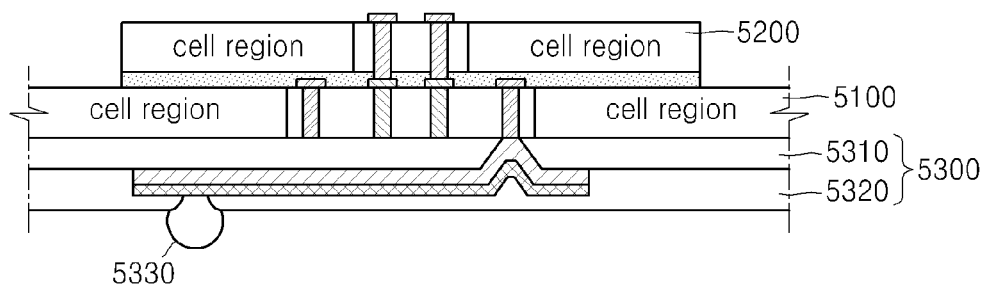
Figure 7A:
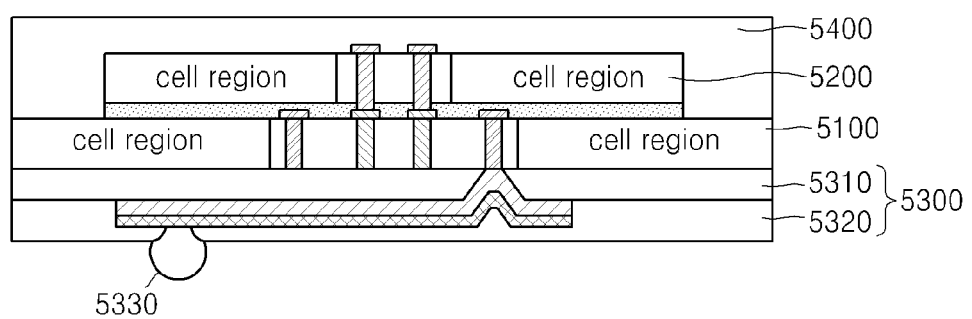

Referring to FIG. 7A(a), an interconnection layer 5300 is formed on a first surface of a first semiconductor chip 5100, which is opposite to a second surface of the first semiconductor chip 5100 on which a second semiconductor chip 5200 is to be disposed. The interconnection layer 5300 may include at least one insulating layer. For example, referring to FIG. 7(a), the interconnection layer 5300 may include first and second insulating layers 5310 and 5320. A metal interconnection may be formed between the first and second insulating layers 5310 and 5320 to be electrically connected to a plurality of vias formed on the first semiconductor chip 5100. In order to electrically connect the metal interconnection layer to the plurality of vias, a seed metal layer may further be disposed between the metal interconnection layers and the plurality of vias as illustrated in FIG. 7A. An opening may be formed in a part of the second insulating layer 5320, and a solder ball 5330 may be electrically connected to the metal interconnection layer via the opening.

Referring to FIG. 7A(b), the second semiconductor chip 5200 is disposed on the second surface of the first semiconductor chip 5100. The second semiconductor chip 5200 may be disposed on the first semiconductor chip 5100 after the interconnection layer 5300 is disposed on the first semiconductor chip 5100. Alternatively, if the first semiconductor chip 5100 and the second semiconductor chip 5200 are different from each other in size, then a sawing process may be performed on a wafer having a plurality of the second semiconductor chips 5200 in order to separate the plurality of the second semiconductor chips 5200 from one another, and the separated second semiconductor chips 5200 may be disposed on a wafer having a plurality of the first semiconductor chips 5100. Then, the sawing process may be performed on the wafer having the plurality of the first semiconductor chips 5100. Next, referring to FIG. 7A(c), a molding layer 5400 is formed to cover the first semiconductor chip 5100 and the second semiconductor chip 5200. The molding layer 5400 may be formed according to a well-know method, e.g., a dipping method or a spin coating method. Although it is described that the solder ball 5330 is electrically connected to the metal interconnection layer via the opening in the second insulating layer 5320 when the interconnection layer 5300 is disposed on the first surface of the first semiconductor chip 5100, but the solder ball 5330 may be electrically connected to the metal interconnection layer via the opening in the second insulating layer 5320 after the molding layer 5400 is formed to cover the first semiconductor chip 5100 and the second semiconductor chip 5200.

Figure 7B:
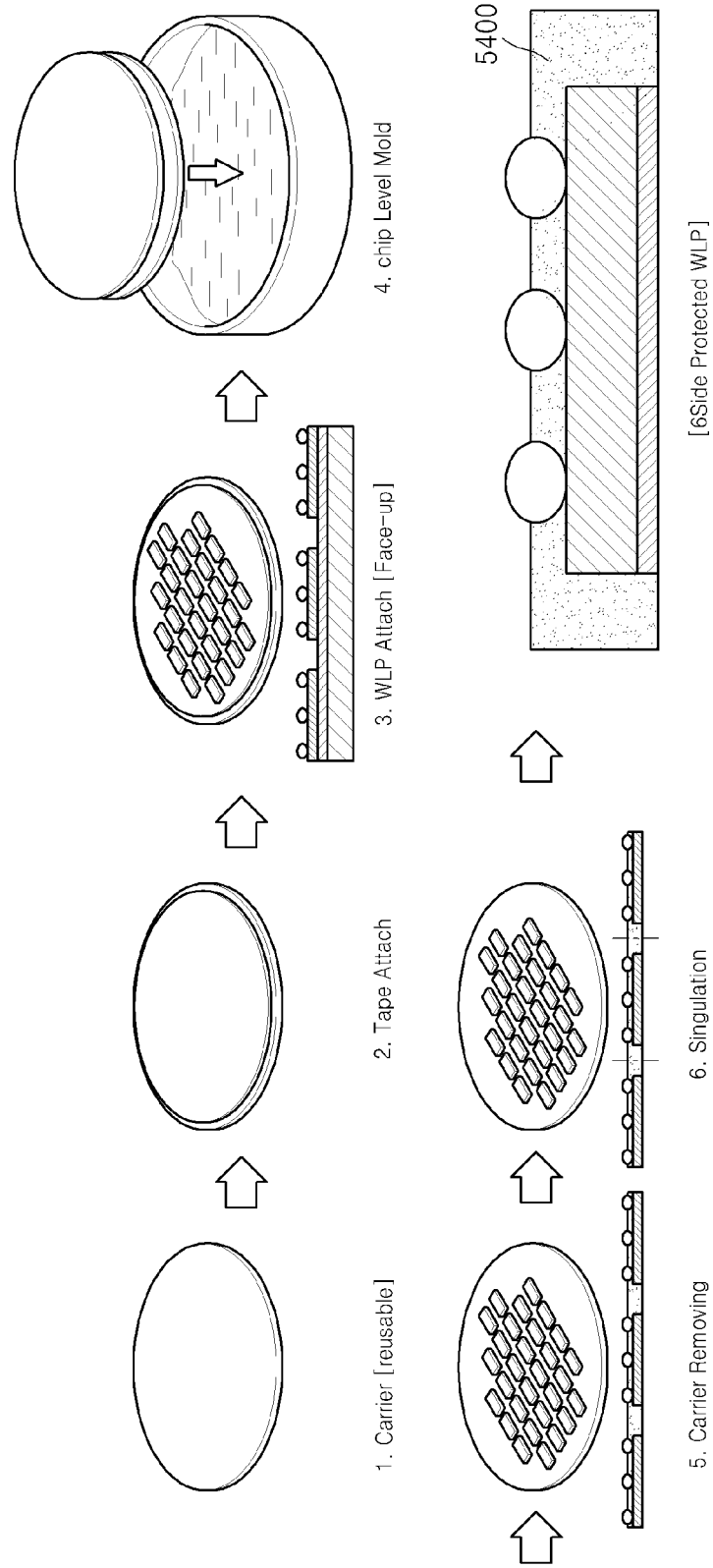
Figure 7C:
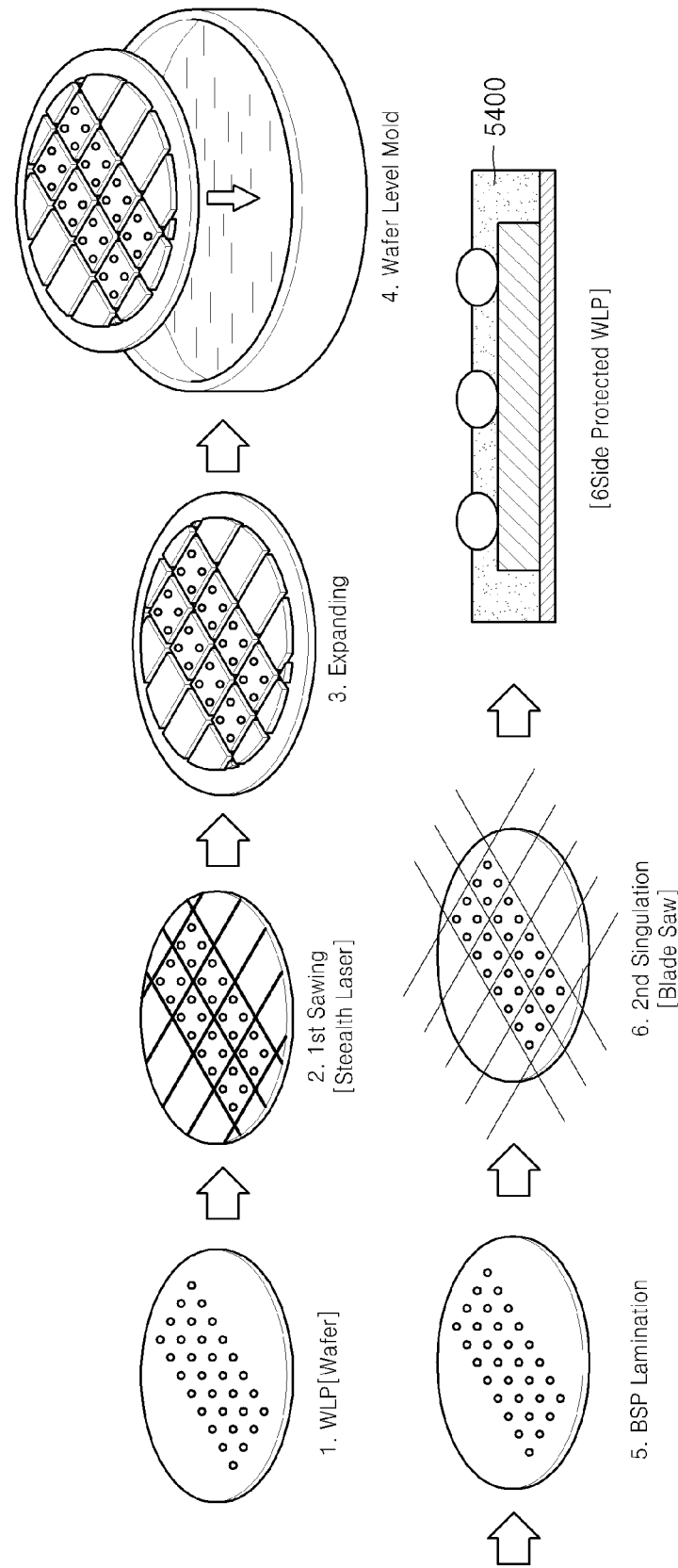

FIGS. 7B and 7C illustrate exemplary embodiments of a process of forming the molding layer 5400 as illustrated in FIG. 7A. In detail, FIG. 7B illustrates a chip-level molding process. Referring to FIGS. 7A and 7B, first, a sawing process is performed on each of the first wafer having a plurality of the first chips 5100 and the second wafer having a plurality of the second chips 5200, and the separated chips are attached onto a carrier and an adhesive device, e.g., a tape. As described above, a stacked structure of a plurality of the first semiconductor chips 5100 and a plurality of the second semiconductor chips 5200 of FIG. 7A may be attached onto the tape. Preferably, a second surface of the second semiconductor chip 5200, which is opposite to a first surface on which the first semiconductor chip 5100 is disposed, may be attached onto the tape. Next, the molding layer 5400 is formed on the carrier attached with the plurality of semiconductor chips by using a predetermined molding resin, the carrier is removed, and then, the sawing process is performed to separate the plurality of semiconductor chips that are connected to one another via the molding layer 5400. Accordingly, all the surfaces of the first and second semiconductor chips 5100 and 5200 except for a part of the solder ball 5330 are protected by the molding layer 5400. If the sawing process is performed according to the size of the first semiconductor chip 5100 in order to separate the first and semiconductor chips 5100 and 5200 that are connected by the molding layer 5400, then a semiconductor package may be obtained having a size that is the same as that of the first semiconductor chip 5100, thereby reducing the size of the memory package.

FIG. 7C illustrates a wafer-level molding process according to one embodiment. Referring to FIGS. 7A and 7C, a first sawing process is performed on stacked wafers having the plurality of the first and second semiconductor chips 5100 and 5200, and then, an expanding process is performed on the wafer by using a predetermined polymer. Next, the molding layer 5400 is formed on the wafers by using a predetermined molding resin, the polymer is removed, and then, a second sawing process is performed on the resultant structure.

Figure 7D:
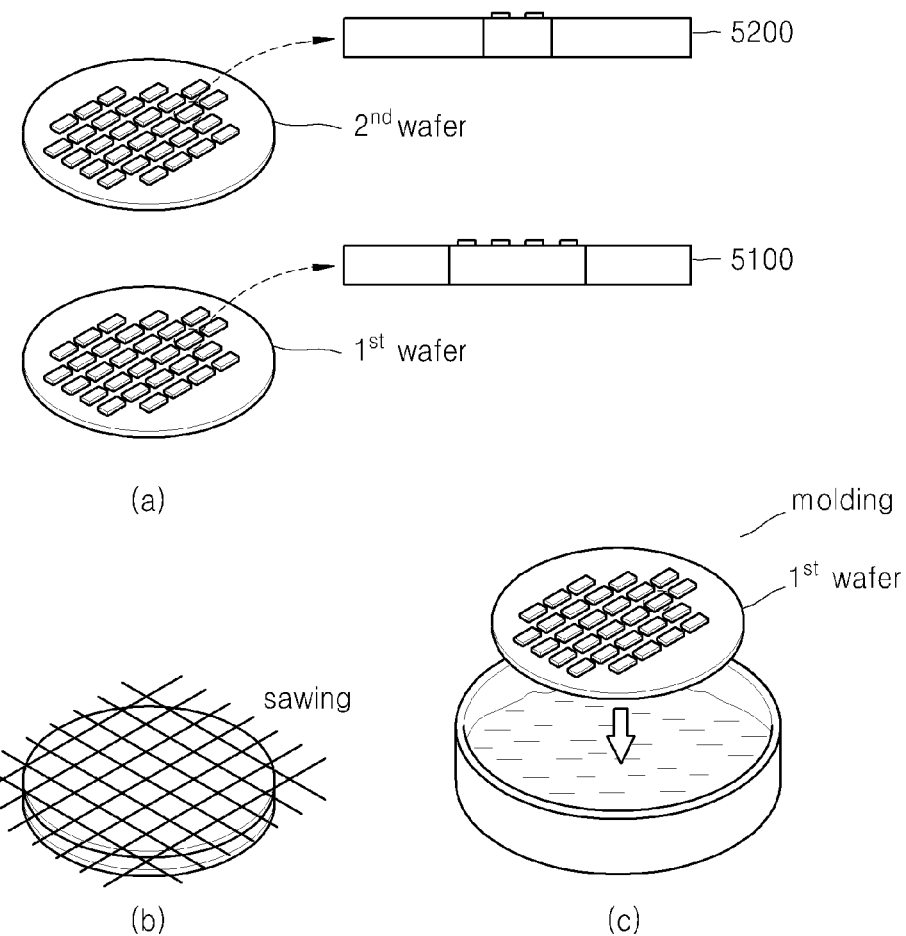

FIG. 7D illustrates a case where a sawing process is performed once on the first and second semiconductor chips 5100 and 5200 of FIG. 7A when the size of the first semiconductor chip 5100 is equal to that of the second semiconductor chip 5200, according to one embodiment. After performing the sawing process as illustrated in FIG. 7D, the molding layer 5400 may be formed on the resultant structure by either using the chip-level molding process of FIG. 7B or the wafer-level molding process of FIG. 7C.

Figure 8A:
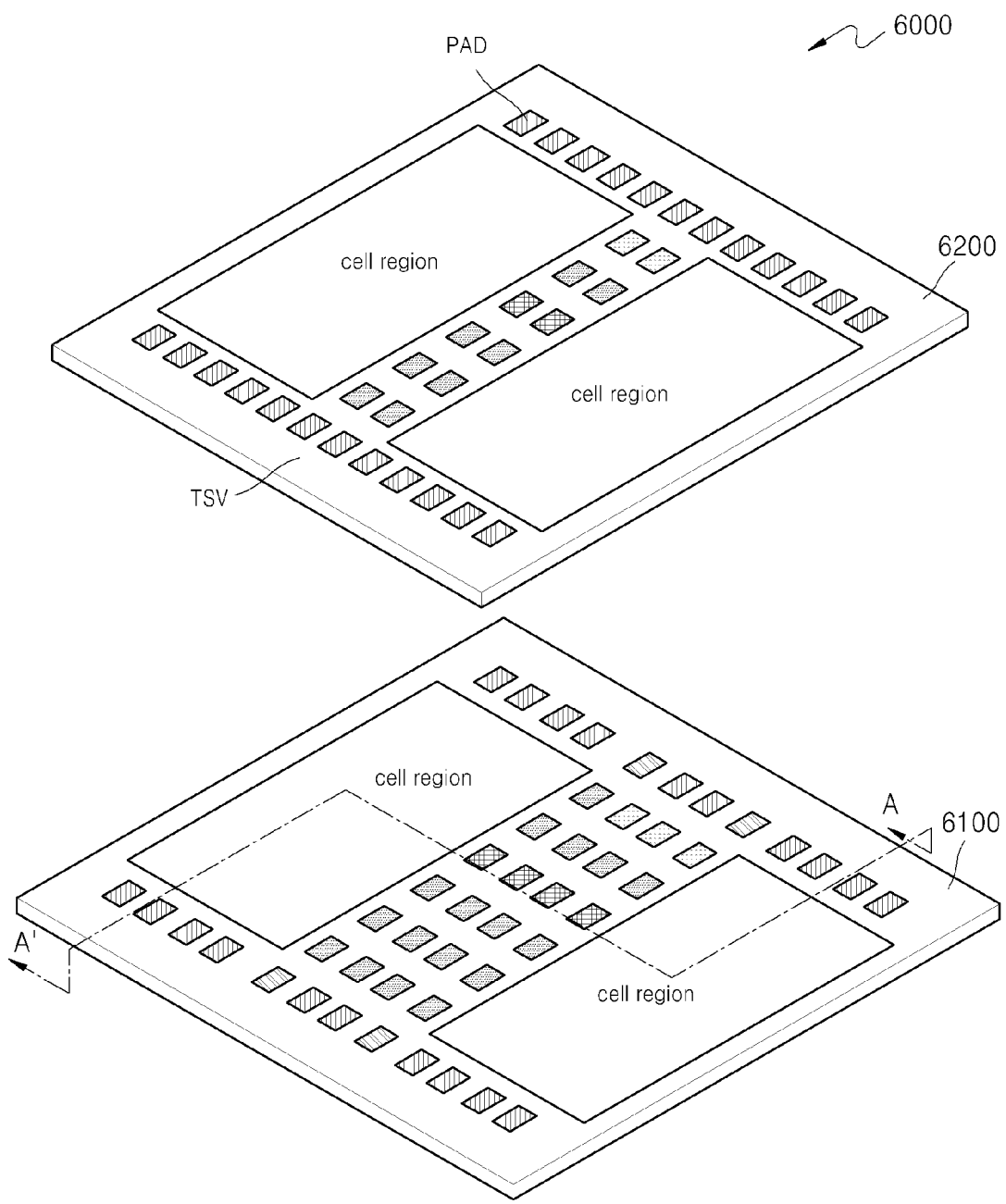
FIGS. 8A and 8B illustrate an exemplary structure of a semiconductor memory device according to one embodiment.
Figure 8B:
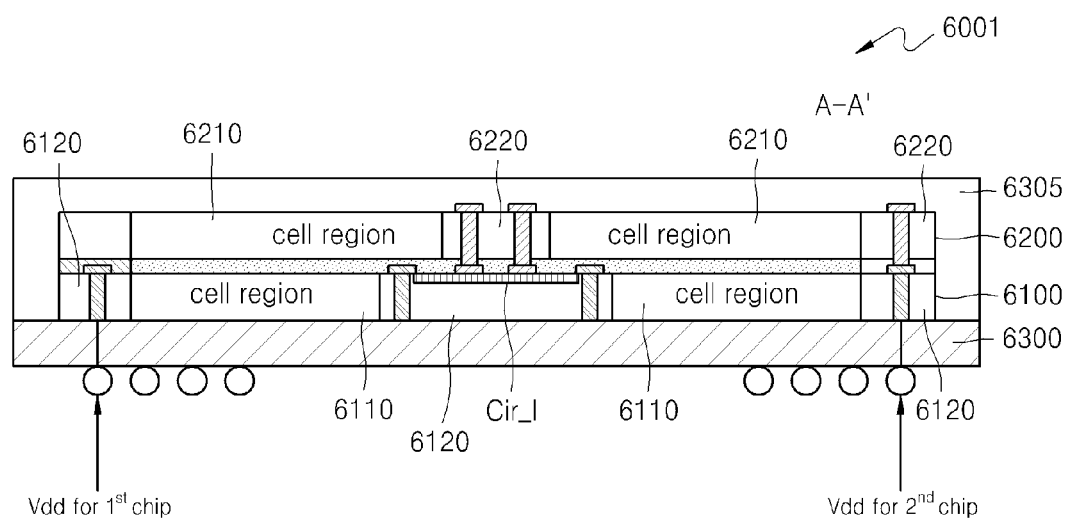

FIGS. 8A and 8B illustrate the structure of an exemplary semiconductor memory device 6000 and a semiconductor package 6001 according to one embodiment. In detail, FIG. 8A illustrate the structures of a first semiconductor chip 6100 and a second semiconductor chip 6200 included in the semiconductor memory device 6000. FIG. 8B is a cross-sectional view taken along the line A-A' of the semiconductor package 6001 including the semiconductor memory device 6000 of FIG. 8A.

Referring to FIG. 8A, a plurality of pads PAD and a plurality of vias TSV are formed on the first semiconductor chip 6100 and the second semiconductor chip 6200. In the above previous embodiments, it is simply described that a plurality of pads PAD and a plurality of vias TSV are arranged between memory cell regions, but actually, the plurality of pads PAD and the plurality of vias TSV may also be arranged in other regions, e.g., along the edges, of a semiconductor chip. That is, the peripheral region of the chips that includes pads and TSVs may be in the center of the chip, as described previously, and/or may also encompass other regions of the chips, such as the outer edges on the surfaces of the chips as shown in FIG. 8A. Also, when a semiconductor chip is actually fabricated, the plurality of pads PAD and the plurality of vias TSV may be arranged in additional configurations different from those illustrated in FIG. 8A.

Referring to FIG. 8B, each of the first semiconductor chip 6100 and the second semiconductor chip 6200 includes a memory cell region in which a memory cell array is disposed, and a peripheral region (pad region) in which the plurality of pads PAD and the plurality of vias TSV are arranged. The first semiconductor chip 6100 includes a first region 6110 in which a memory cell is disposed, and a second region 6120 in which a peripheral circuit, the plurality of pads PAD and the plurality of vias TSV are disposed. The second semiconductor chip 6200 includes a third region 6210 in which a memory cell array is disposed, and a fourth region 6220 in which the plurality of pads PAD and the plurality of vias TSV are disposed. Also, as illustrated in FIG. 8B, the peripheral region may be formed inside and along the edges of each of the first and second semiconductor chips 6100 and 6200. Further, the semiconductor package 6001 may include a molding unit 6305 for molding the semiconductor chips 6100 and 6200 and the package substrate 6300.

In the current embodiment of FIGS. 8A and 8B, a path in which a supply voltage Vdd or a ground voltage Vss is applied to the first semiconductor chip 6100 may be determined to be different and electrically isolated from a path in which the supply voltage Vdd or the ground voltage Vss is applied to the second semiconductor chip 6200. FIG. 8B illustrates a case where the supply voltage Vdd is applied to the first semiconductor chip 6100 and the second semiconductor chip 6200 via the pads PAD and vias TSV formed along the edges thereof. Referring to FIG. 8B, the supply voltage Vdd may be applied to the first semiconductor chip 6100 via a dedicated TSV on the second region 6120 at one edge of the first semiconductor chip 6100 and may be applied to the second semiconductor chip 6200 via a dedicated pair of TSVs, one on the second region 6120 at another edge of the first semiconductor chip 6100 and one on the fourth region 6220, which is connected to the TSV on the second region 6120 at the other edge of the first semiconductor chip 6100. As such, each semiconductor chip is electrically connected to a supply voltage source via a dedicated path. Control signals that include data, a command, and an address may be supplied via TSV on the second region 6120 inside the first semiconductor chip 6100, and a control signal and data for driving the second semiconductor chip 6200 may be supplied to the second semiconductor chip 6200 via an internal circuit Cir_I in the first semiconductor chip 6100.

Figure 9A:
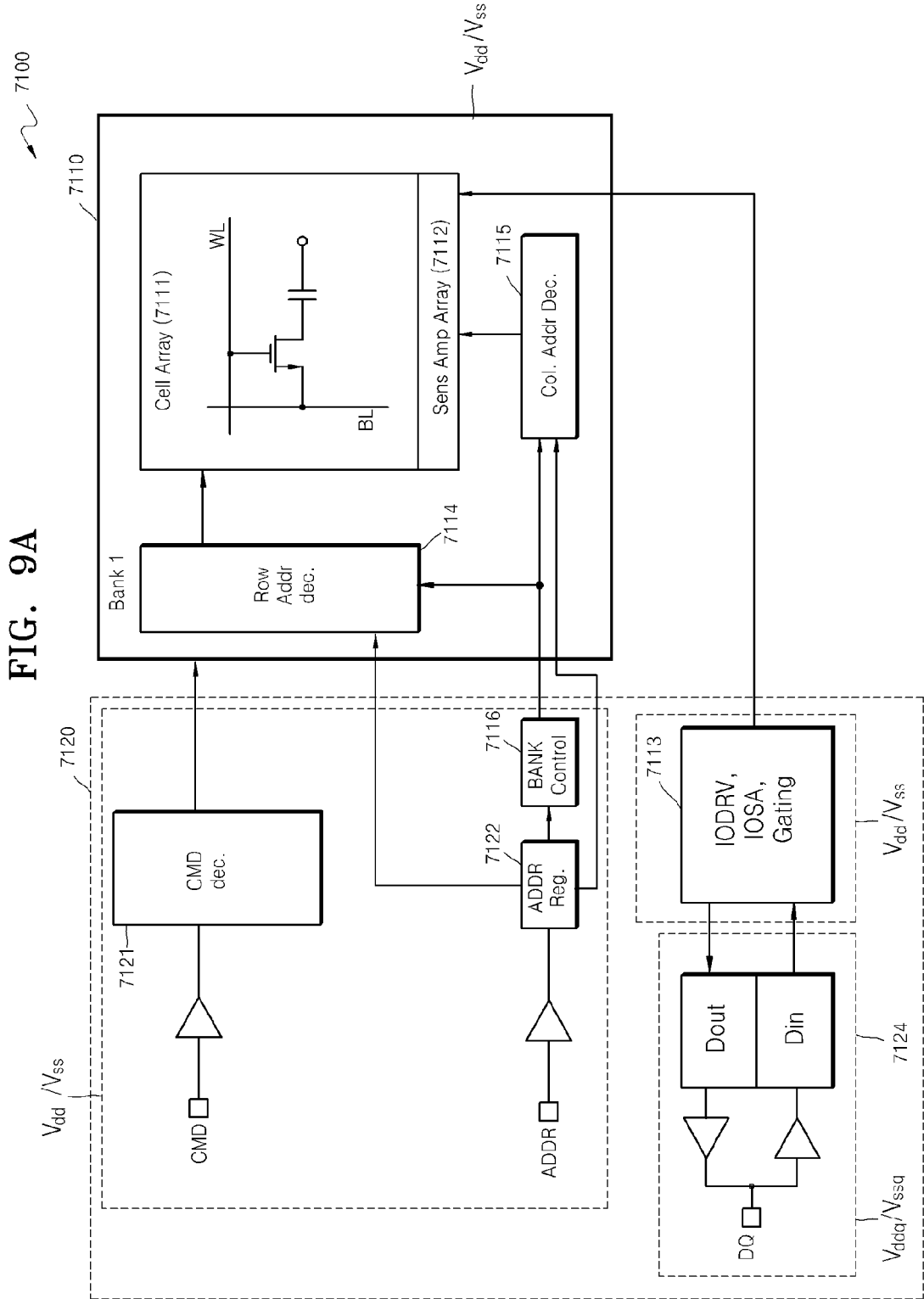
FIG. 9A is a block diagram of an exemplary master semiconductor chip according to one embodiment.

FIG. 9A is a block diagram of an exemplary master semiconductor chip 7100 according to one embodiment. Referring to FIG. 9A, the master semiconductor chip is a first chip that includes a first region 7110, e.g., a memory cell region, and second region 7120, e.g., a peripheral region. In one embodiment, the first region may be a memory bank that includes a memory cell array 7111, a sense amplifier array 7112, a row address decoder 7114, and a column address decoder 7115. The second region may include a command decoder 7121 that decoders an external command signal, an address register 7122, a bank controller 7116, a data I/O unit 7124, and an input/output (I/O) driver, I/O sense amplifier, and gating circuitry 7113. In one embodiment, the master chip may include multiple memory banks, in which case, bank controller 7116 may be used to select one of the banks.

In one embodiment, different portions of the master semiconductor chip 7100 receive power independently of each other. For example, the data I/O unit 7124 may receive a voltage of Vddq and Vssq from a first power source, while the remainder of peripheral circuit 7120 receives a voltage of Vdd and Vss from a second power source. In addition, first region 7110 of master semiconductor chip 7100 may receive a voltage that is the same as the Vdd and Vss voltage, received from the same power source as the remainder of the peripheral circuit 7120 or received from a different power source. In one embodiment, Vddq and Vssq are dedicated to circuit for the data I/O unit 7124, and thus are electrically isolated within the chip from other portions of the chip. That is, Vddq and Vssq are not electrically connected to any other circuitry other than the data input/output circuitry in the peripheral region of the master semiconductor chip 7100. In one embodiment, Vddq has a lower voltage value than Vdd, in order to reduce the power consumption in the data input/output circuit.

Figure 9B:
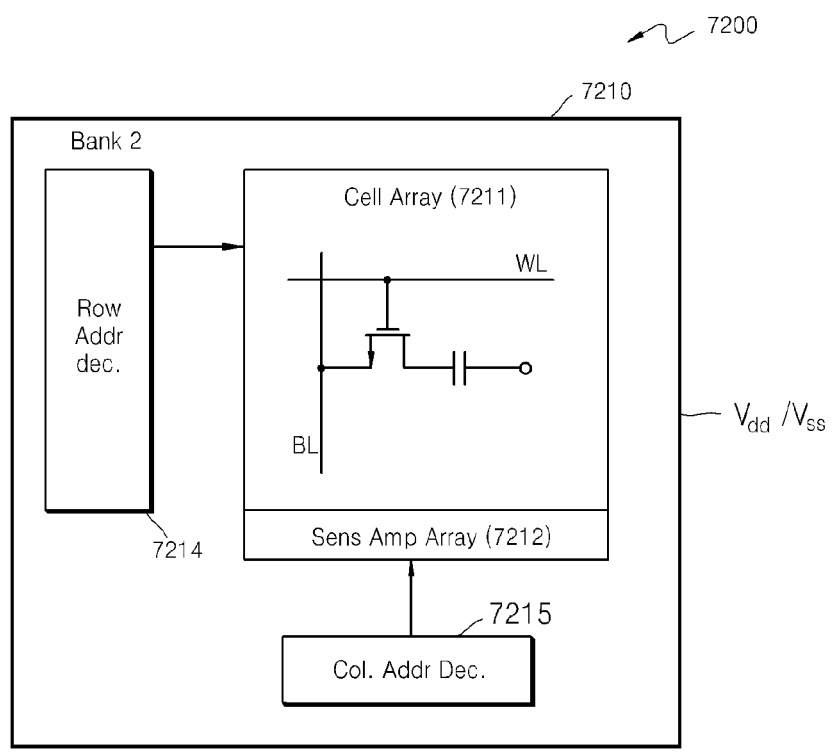
FIG. 9B is a block diagram of an exemplary slave semiconductor chip according to one embodiment.

FIG. 9B is a block diagram of an exemplary slave semiconductor chip 7200 according to one embodiment. Referring to FIG. 9B, the slave semiconductor chip is a second chip that includes only a memory cell region 7210 and a pad region, but not a peripheral circuit region such as in master semiconductor chip 7100. In one embodiment, the memory cell region may be a memory bank that includes a memory cell array 7211, a sense amplifier array 7212, a row address decoder 7214, and a column address decoder 7215. In one embodiment, these elements have the same layout as the respective elements in the master chip shown in FIG. 9A.

In one embodiment, slave semiconductor chip 7200 receives from a power source the same voltage Vdd and Vss as the Vdd and Vss applied to the memory cell region 7110 master semiconductor chip 7100. Alternatively, different voltages may be applied to semiconductor chip 7200 compared to master semiconductor chip 7100.

Figure 9C:
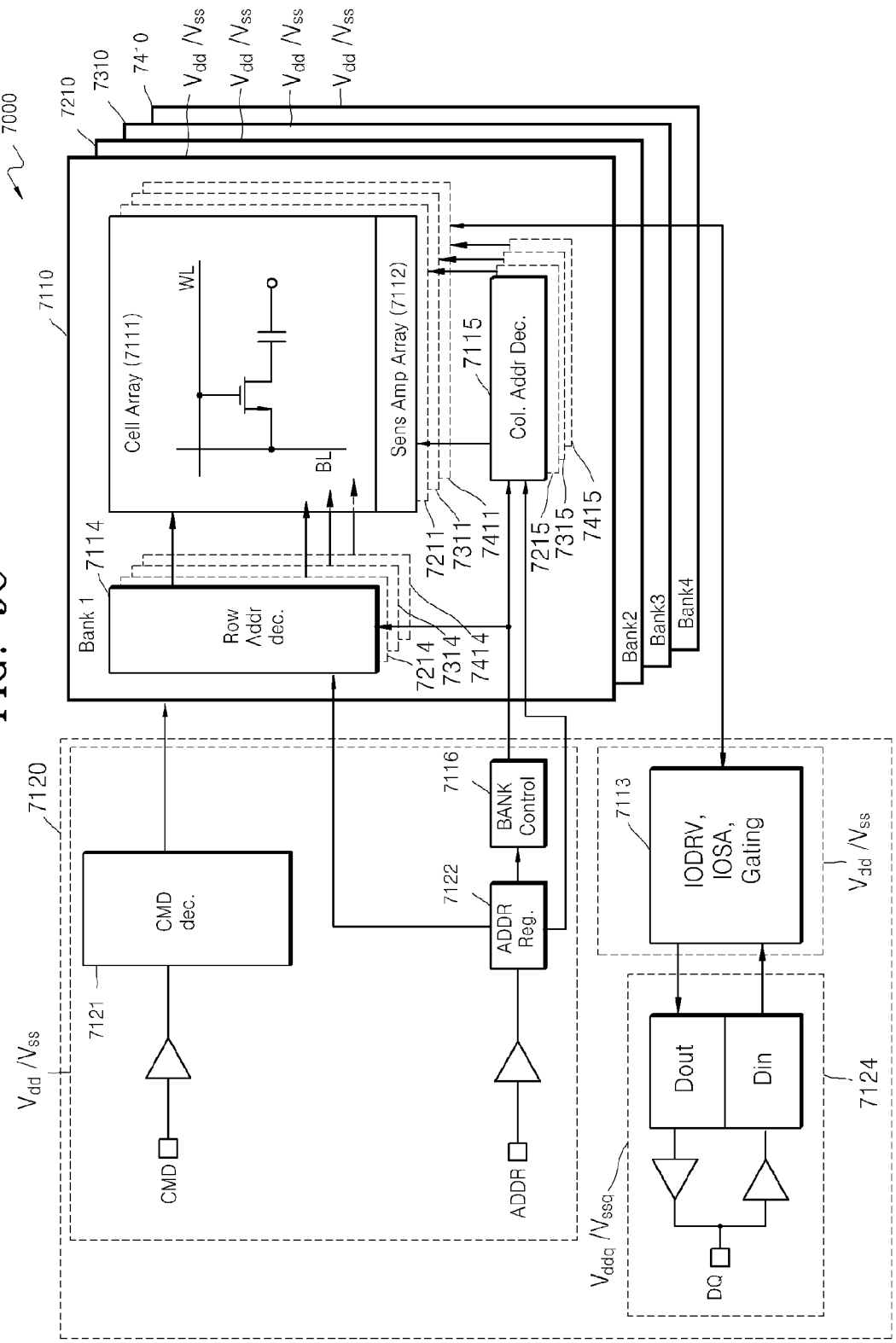
FIG. 9C is a block diagram of an exemplary semiconductor package according to one embodiment.

FIG. 9C is a block diagram of an exemplary semiconductor device 7000 according to the disclosed embodiments. In one embodiment, semiconductor device 7000 includes a set of chips, including a master semiconductor chip including a memory cell region 7110 and peripheral region 7120 (including a pad region) such as discussed above in connection with FIG. 9A, and a set of additional slave semiconductor chips including memory cell regions 7210, 7310, 7410, etc., and pad regions such as described above in connection with FIG. 9B. Although only three additional semiconductor chips are shown, semiconductor device 7000 may include further additional semiconductor chips.

As shown in FIG. 9C, each additional semiconductor chip may include a memory cell region (7210, 7310, 7410), including a cell array (7211, 7311, 7411), a sense amplifier array (7212, 7312, 7412), a column address decoder (7215, 7315, 7415), and a row address decoder (7214, 7314, 7414). Each additional semiconductor chip can be controlled by the peripheral circuit of the master semiconductor chip. For example, commands are received at each additional semiconductor chip from command decoder 7121, an address is received at each additional semiconductor chip from address register 7122, a chip (or memory bank, as the chips are labeled) may be selected using bank controller 7116, and input and output data can be controlled by data i/o unit 7124 and input/output (I/O) driver, I/O sense amplifier, and gating circuitry 7113. In one embodiment, the slave semiconductor chips may include multiple memory banks, in which case, bank controller 7116 may be used to select one of the banks.

The supply voltage Vdd and/or ground voltage Vss that is applied to the first (master) semiconductor chip and the additional second (slave) semiconductor chips may be used to drive the memory cell regions or peripheral regions. However, when the supply voltage Vdd and/or the ground voltage Vss are used to drive the memory cell regions, noise generated in the supply voltage Vdd and/or the ground voltage Vss may degrade memory performance. Thus, as described in the above previous embodiments, a path in which the supply voltage Vdd and/or the ground voltage Vss is applied to the first semiconductor chip may be a dedicated, electrically isolated path compared to a path in which the supply voltage Vdd and/or the ground voltage Vss is applied to the second semiconductor chips.

Furthermore, the supply voltage Vdd and/or the ground voltage Vss may be applied to various blocks of the memory cell regions from the outside. In some cases, the degree of degradation in memory performance when a supply voltage Vdd and/or a ground voltage Vss containing noise is applied to some blocks of the memory cell regions, may be different than when the supply voltage Vdd and/or the ground voltage Vss containing noise is applied to the other blocks. Thus, in one embodiment, the supply voltage Vdd and/or the ground voltage Vss is applied to some blocks of the memory cell regions of the first semiconductor chip and the second semiconductor chips in the same path and is applied to the other blocks of the memory cell regions of the first semiconductor chip and the second semiconductor chips in different paths.

For example, even if the supply voltage Vdd and/or the ground voltage Vss containing noise is applied to the row address decoders 7114, 7214, 7314, and 7414 and the column address decoders 7115, 7215, 7315, and 7415, the degree of degradation in memory performance is relatively small. Thus, the supply voltage Vdd and/or the ground voltage Vss may be applied to the row address decoder 7114 of the first semiconductor chip and the row address decoders 7214, 7314, and 7414 of the second semiconductor chips via the same electrical path (i.e., through TSVs in an aligned stack that is electrically connected to each of the four semiconductor chips). Also, the supply voltage Vdd and/or the ground voltage Vss may be applied to the column address decoder 7115 of the first semiconductor chip and the column address decoders 7215, 7315, and 7415 of the second semiconductor chips in the same path. To this end, the supply voltage Vdd or the ground voltage Vss is applied to the row address decoder 7114 or the column address decoder 7115 of the first semiconductor chip through a second via (not shown) on the first semiconductor chip. Also, the supply voltage Vdd or the ground voltage Vss may be applied to the row address decoders 7214, 7314, and 7414 or the column address decoders 7215, 7315, and 7415 of the second semiconductor chips through the third via (not shown) that are formed on the second semiconductor chips and are electrically connected to the second via.

However, when noise occurs in the supply voltage Vdd and/or the ground voltage Vss applied to a memory bank or a sense amplifier, memory performance is degraded greatly. Thus, the supply voltage Vdd and/or the ground voltage Vss may be applied to the memory bank 7111 and the sense amplifier 7112 of the first semiconductor chip in a path different from and electrically isolated from the path in which the supply voltage Vdd and/or the ground voltage Vss are applied to the second semiconductor chips. For example, the supply voltage Vdd or the ground voltage Vss is applied to the memory bank 7111 or the sense amplifier 7112 of the first semiconductor chip through a first via (not shown) on the first semiconductor chip but is applied to the memory banks 7211, 7311, and 7411 or the sense amplifiers 7212, 7312, and 7412 of the second semiconductor chips through the second via that is insulated from the first via and is formed on the first semiconductor chip and through the third vias on the second semiconductor chips.

Figure 10A:
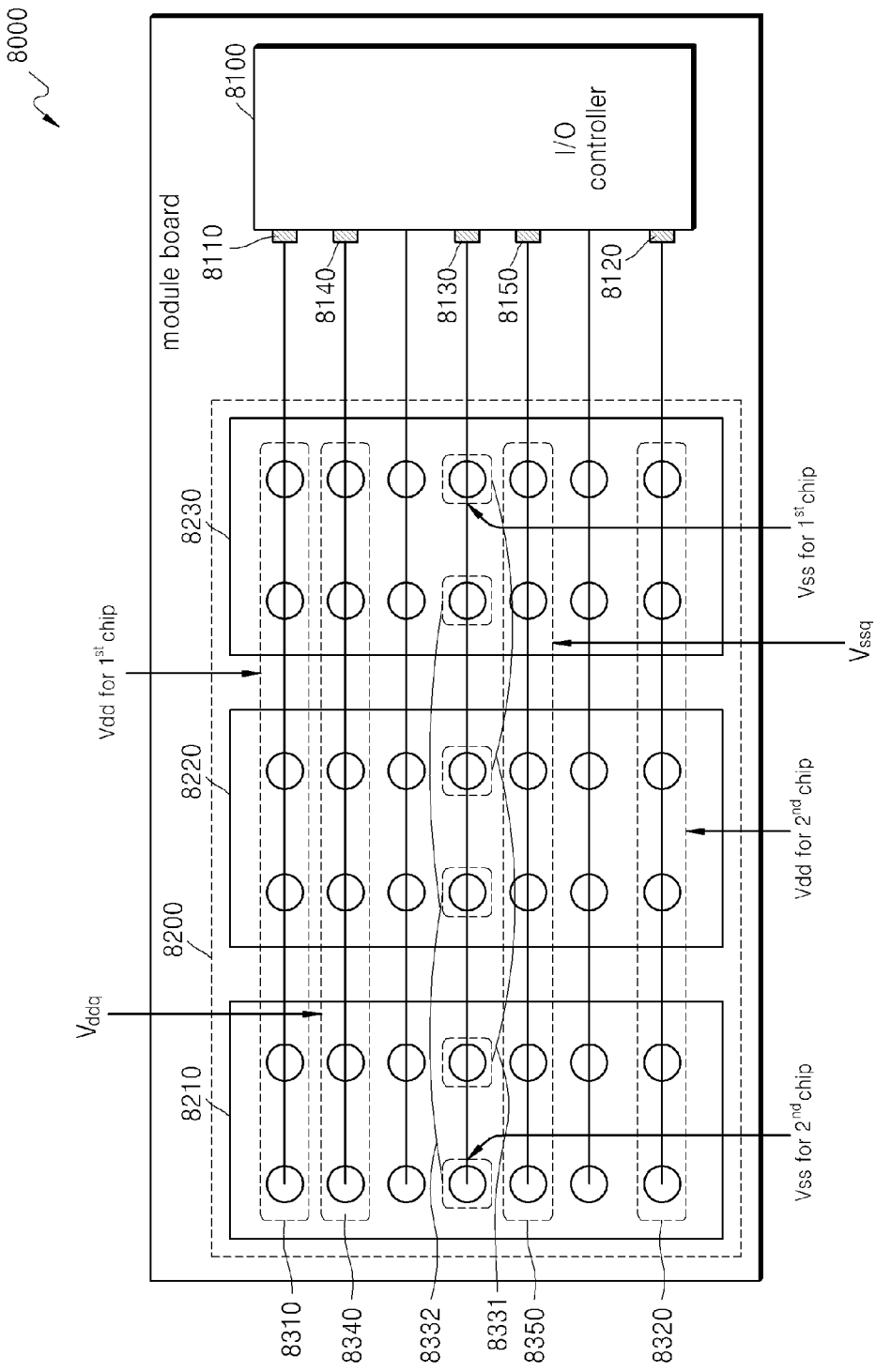
FIGS. 10A and 10B illustrate exemplary embodiments of a semiconductor memory system.
Figure 10B:
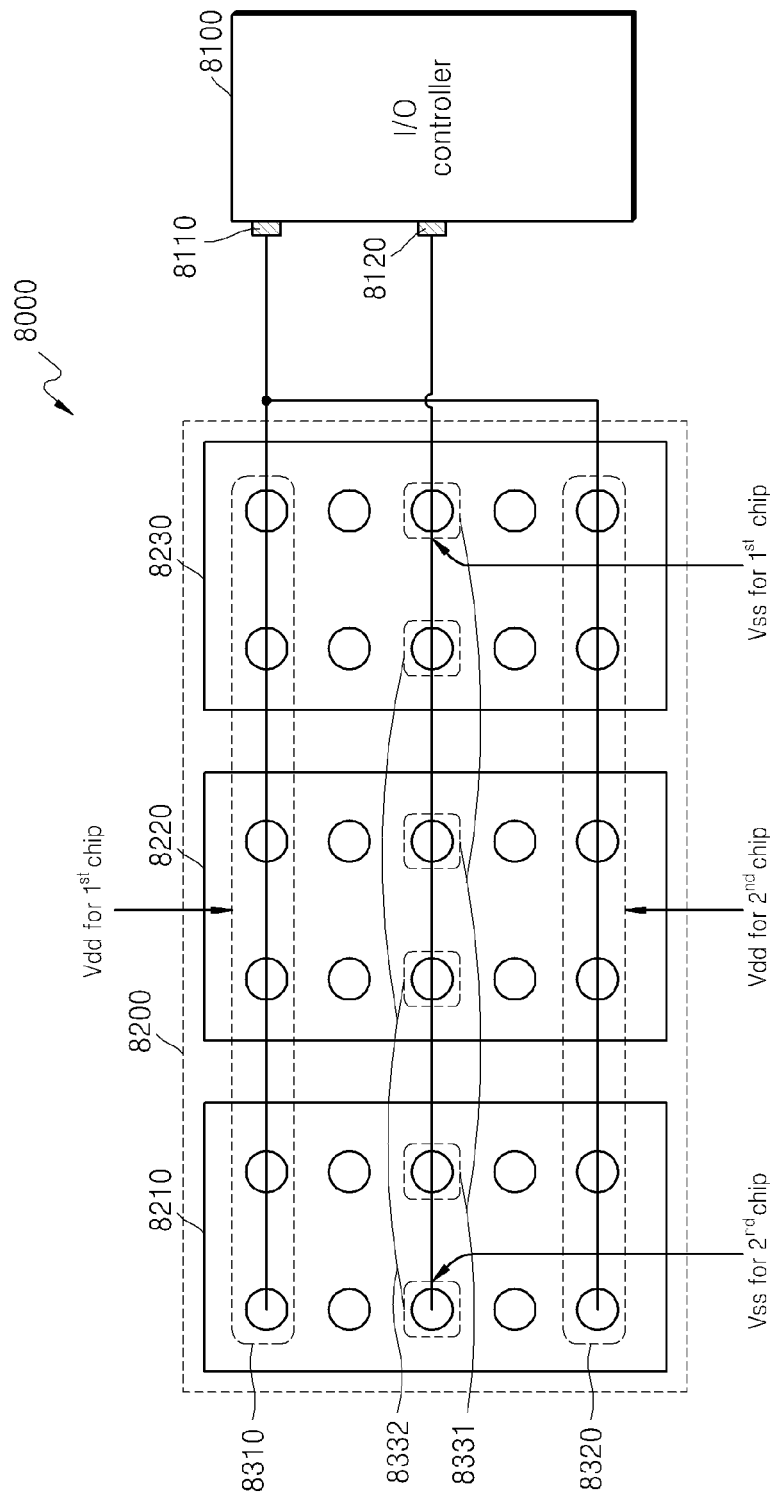

FIGS. 10A and 10B illustrate examples of a semiconductor memory system (or a semiconductor package module) 8000 according to the disclosed embodiments. Referring to FIG. 10A, the semiconductor memory system 8000 may include a memory controller 8100 and a semiconductor package group 8200 that has at least one semiconductor package. For example, FIG. 10A illustrates that the semiconductor package group 8200 includes first to third memory packages 8210, 8220, and 8230. Each of the first to third memory packages 8210, 8220, and 8230 includes a stacked structure of a first semiconductor chip and at least one second semiconductor chip. In one embodiment, the first to third memory packages 8210, 8220, and 8230 are packages consistent with one or more of the embodiments discussed above.

In one embodiment, the memory controller 8100 and the semiconductor package group 8200 are mounted on a module board, and a plurality of ports included in the memory controller 8100 and a plurality of solder balls that are included in the first to third memory package 8210 to 8230, respectively, are connected to one another via wires on the module board. The ports may be, for example, nodes that are configured to pass electrical signals between the controller and the memory packages. Although not shown, the semiconductor memory system 8000 may be manufactured such that only the semiconductor package group 8200 is mounted on the module board, and the semiconductor memory packages 8210, 8220, and 8230, and the memory controller 8100 are connected to a system bus.

The memory controller 8100 includes the plurality of ports. For example, the memory controller may include first and second ports 8110 and 8120 for applying a supply voltage Vdd, a third port 8130 for applying a ground voltage Vss, and fourth and fifth ports 8140 and 8150 for applying voltages Vddq and Vssq. Also, each of the first to third memory packages 8210 to 8230 may include solder balls 8310 connected to the first port 8110 of the memory controller 8100 in order to apply the supply voltage Vdd to the first semiconductor chips (e.g., master chips) of the packages, solder balls 8320 connected to the second port 8120 of the memory controller 8100 in order to apply the supply voltage Vdd to the second semiconductor chips (e.g., slave chips) of the packages, solder balls 8331 connected to the third port 8130 of the memory controller 8100 in order to apply the ground voltage Vss to the first semiconductor chips of the packages, solder balls 8332 connected to the third port 8130 of the memory controller 8100 in order to apply the ground voltage Vss to the second semiconductor chips of the packages, solder balls 8340 connected to the fourth port 8140 of the memory controller 8100 in order to apply the voltage Vddq, and solder balls 8350 connected to the fifth port 8150 of the memory controller 8100 in order to apply the voltage Vssq. Although two solder balls are shown for supplying Vssq and Vddq to each package, other numbers of solder balls can be used (e.g., one solder ball per package).

Referring to the embodiment shown in FIG. 10A, the supply voltage Vdd is applied to the first semiconductor chip of each of the semiconductor packages via the solder ball connected to the first port 8110 of the memory controller 8100, and is applied to the at least one second semiconductor chip of each of the semiconductor packages via the solder ball connected to the second port 8120 of the memory controller 8100. Also, the ground voltage Vss is applied to the first semiconductor chip via some of the solder balls connected to the third port 8130 of the memory controller 8100, and is applied to the at least one second semiconductor chip via the other solder balls. Although not shown, the solder ball for applying the ground voltage Vss to the first semiconductor chip and the solder ball for applying the ground voltage Vss to the second semiconductor chip, may receive the ground voltage Vss via different ports of the memory controller 8100.

In addition, the supply voltage Vddq and ground voltage Vssq may be applied to a data I/O unit of the first semiconductor chip of each of the semiconductor packages via the solder balls 8340 and 8350 connected to the fourth port 8140 and fifth port 8150, respectively. In one embodiment, Vddq and Vssq are dedicated to and are separate, and electrically isolated from the remainder of the first semiconductor chip and from the second semiconductor chips, such that the power Vddq and Vssq are only supplied to the data I/O unit of the first semiconductor chip. In another embodiment, however, the Vdd and Vss supplied to the data I/O unit of the first semiconductor chip is the same Vdd and Vss from the same power source as the power supplied to the remainder of the first semiconductor chip.

Referring to FIG. 10B, in each of memory packages 8120, 8220, and 8230 of the semiconductor memory system 8000, a solder ball for applying a supply voltage Vdd to a first semiconductor chip and a solder ball for applying the supply voltage Vdd to at least one_second semiconductor chip are connected to the same port on a memory controller 8100. Referring to FIG. 10B, the memory controller 8100 includes a first port 8110 for applying the supply voltage Vdd to the first semiconductor chips via solder balls 8310 and to the second semiconductor chips via solder balls 8310, and a second port 8120 for applying a ground voltage Vss to the first semiconductor chips via solder balls 8331 and to the second semiconductor chips via solder balls 8332. As such, the supply voltage Vdd applied commonly to the solder balls are applied to the first semiconductor chip and the at least one second semiconductor chip of each of the memory packages 8210 to 8230 in different paths, respectively, as is the ground voltage Vss. The solder balls for applying the ground voltage Vss to the first semiconductor chip and the at least one second semiconductor chip of each of the memory packages 8210 to 8230, respectively, are shown as connected commonly to the second port 8120, but may be connected to different ports of the memory controller 8100 as described above.

FIGS. 11A to 11D are cross-sectional views of exemplary embodiments of a semiconductor package 9000A. In particular, in these embodiments, the semiconductor package 9000A includes different types of memory cells, e.g., a volatile memory cell and a non-volatile memory cell.

Figure 11A:
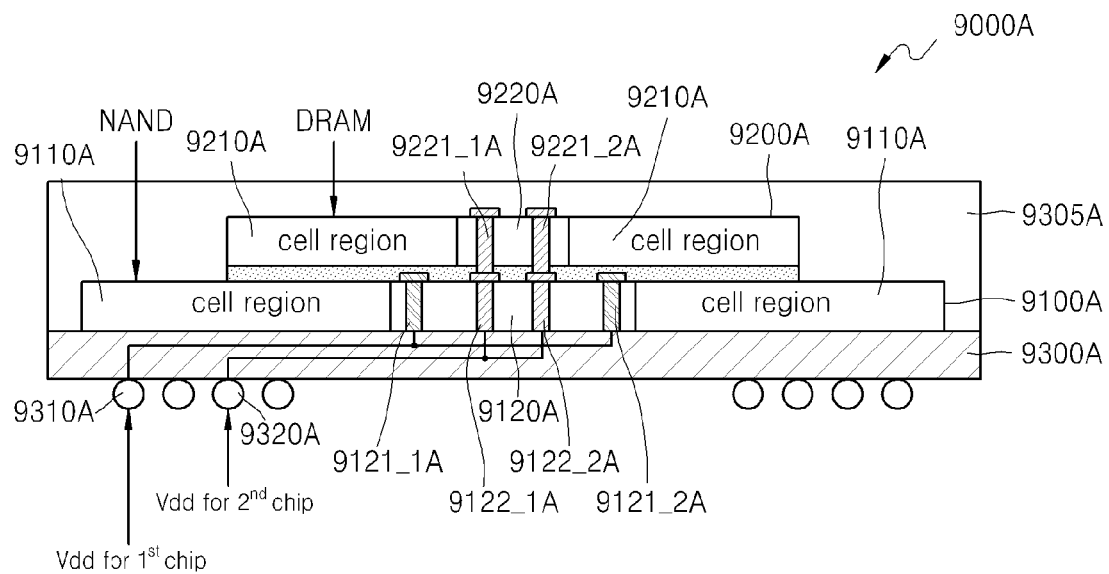
FIGS. 11A to 11D illustrate exemplary cross-sectional views of other embodiments of a semiconductor package.

Referring to FIG. 11A, the semiconductor package 9000A may include different types of semiconductor chips, e.g., a first type semiconductor chip 9100A having a NAND cell as a non-volatile memory and a second type semiconductor chip 9200A having a dynamic random access memory (DRAM) cell. FIG. 11A illustrates a case where the second type semiconductor chip 9200A is disposed on the first type semiconductor chip 9100A and the size of the first type semiconductor chip 9100A is greater than that of the second type semiconductor chip 9200A. However, the disclosed embodiments are not limited thereto, and the size of the first type semiconductor chip 9100A may be less than that of the second type semiconductor chip 9200A and the first type semiconductor chip 9100A may be disposed on the second type semiconductor chip 9200A. Also, although FIG. 11A illustrates that the semiconductor package 9000A includes one first type semiconductor chip 9100A and one second type semiconductor chip 9200A, the semiconductor package 9000A may include a plurality of the first type semiconductor chips 9100A or a plurality of the second type semiconductor chip 9200A. Further, the semiconductor package 9000A may include a molding unit 9305A for molding the semiconductor chips 9100A to 9200A and the package substrate 9300A.

The first type semiconductor chip 9100A may include a first region 9110A in which a NAND cell array is disposed, and a second region 9120A in which a plurality of pads and a plurality of vias are disposed. If the first type semiconductor chip 9100A acts as a master chip, a peripheral circuit may further be disposed in the second region 9120A to drive the NAND cell. Similarly, the second type semiconductor chip 9200A may include a third region 9210A in which a DRAM cell is disposed, and a fourth region 9220A in which a plurality of pads and a plurality of vias are disposed. If the second type semiconductor chip 9200A acts as a master chip, a peripheral circuit may further be disposed in the fourth region 9220A to drive the DRAM cell.

The first type semiconductor chip 9100A and the second type semiconductor chip 9200A may communicate with a memory controller (not shown) by using different paths. For example, the first type semiconductor chip 9100A and the second type semiconductor chip 9200A may communicate with the memory controller via different solder balls, respectively, and may exchange a signal with each other via different vias in the semiconductor package 9000A. FIG. 11A illustrates a case where a path in which a supply voltage Vdd is applied to the first type semiconductor chip 9100A is different from a path in which the supply voltage Vdd is applied to the second type semiconductor chip 9200A.

On the second region 9120A, vias 9121_1A and 9121_2A are formed to apply the supply voltage Vdd to the first type semiconductor chip 9100A, and vias 9122_1A and 9122_2A are formed to apply the supply voltage Vdd to the second type semiconductor chip 9200A. The vias 9121_1A and 9121_2A are connected commonly to a first solder ball 9310A, and the vias 9122_1A and 9122_2A are connected commonly to a second solder ball 9320A. On the fourth region 9220A, vias 9221_1A and 9221_2A are formed to apply the supply voltage Vdd to the second type semiconductor chip 9200A. The vias 9221_1A and 9221_2A on the fourth region 9220A are aligned with the second vias 9122_1A and 9122_2A, respectively, and are applied the supply voltage Vdd and transfer the supply voltage Vdd to the second type semiconductor chip 9200A via the second vias 9122_1A and 9122_2A.

Figure 11B:
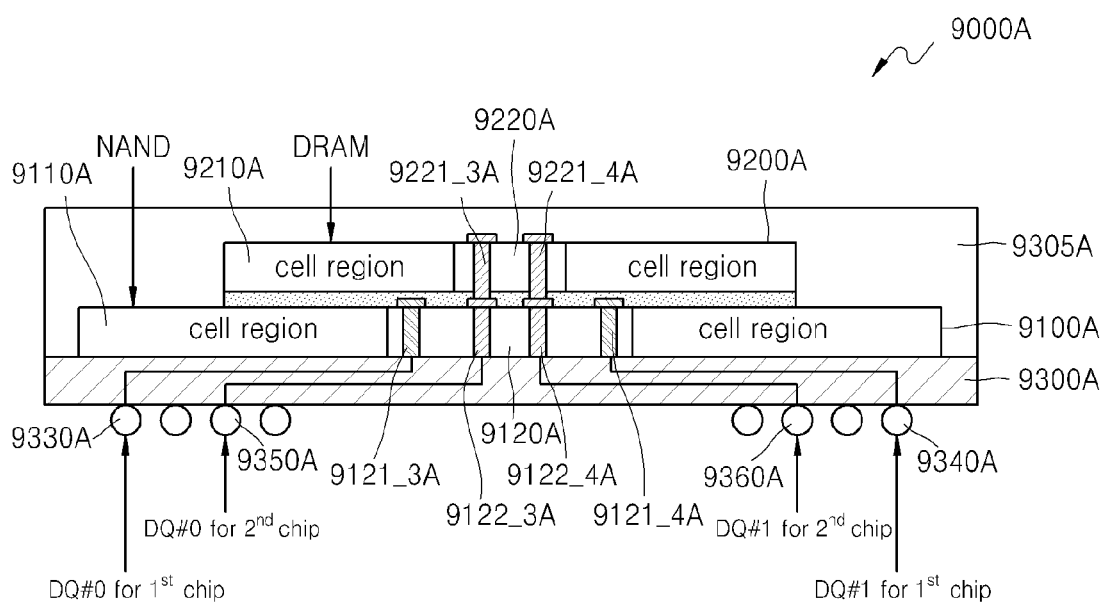

FIG. 11B is an exemplary cross-sectional view illustrating a signal path related to data input to and output from the semiconductor package 9000A. Referring to FIG. 11B, the first type semiconductor chip 9100A and the second type semiconductor chip 9200A may exchange data with an external memory controller (not shown) in different paths. To this end, the first type semiconductor chip 9100A and the second type semiconductor chip 9200A communicate with the external memory controller via different solder balls. For example, the first type semiconductor chip 9100A communicates with the external memory controller via third and fourth solder balls 9330A and 9340A, and the second type semiconductor chip 9200A communicates with the external memory controller via fifth and sixth solder balls 9350A and 9360A. On the second region 9120A, vias 9121_3A and 9121_4A are formed to be connected to the third and fourth solder balls 9330A and 9340A in order to transmit data to the first type semiconductor chip 9100A, and vias 9122_3A and 9122_4A are formed to be connected to the fifth and sixth solder balls 9350A and 9360A in order to transmit data to the second type semiconductor chip 9200A. Also, on the fourth region 9220A, vias 9221_3A and 9221_4A are formed to be aligned with the vias 9122_3A and 9122_4A in order to transmit data to the second type semiconductor chip 9200A.

Figure 11C:
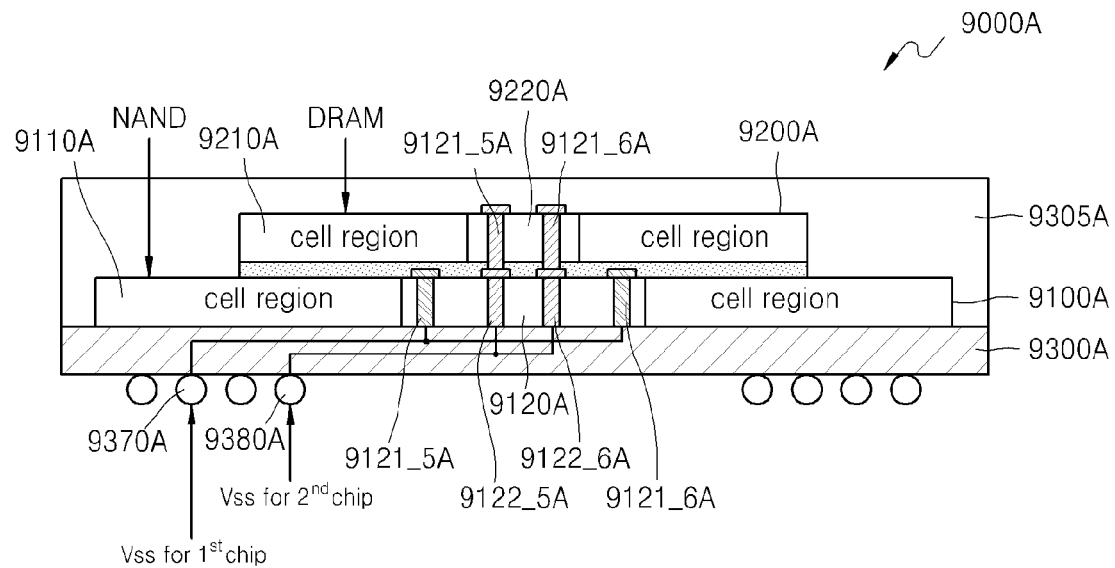
Figure 11D:
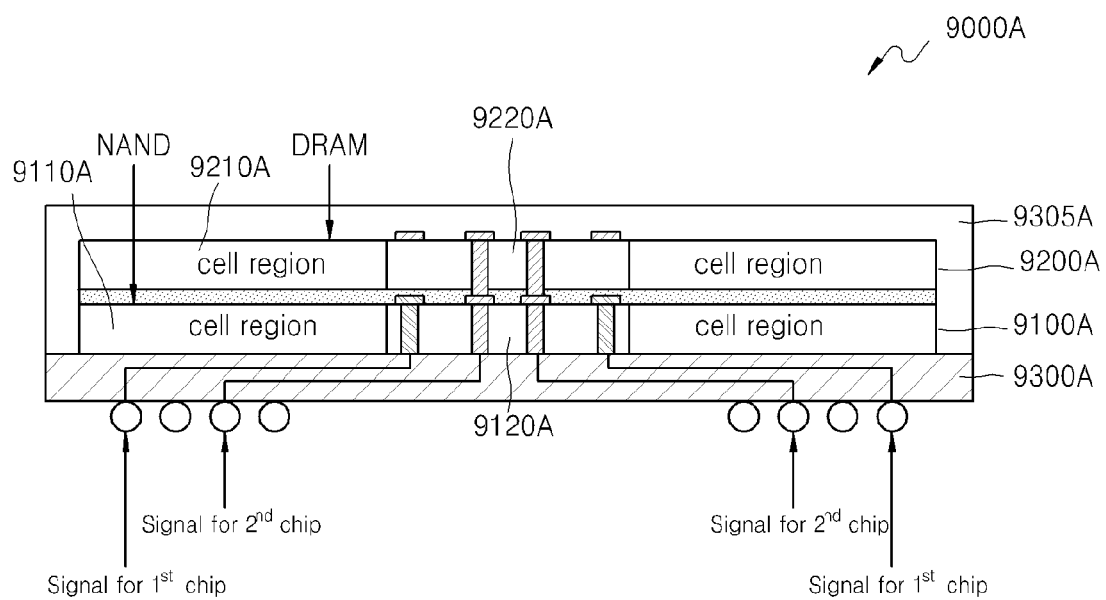

FIG. 11C is an exemplary cross-sectional views illustrating a signal path in which a ground voltage Vss is applied to the semiconductor package 9000A. In the current embodiment, the ground voltage Vss may also be applied as described above with reference to FIGS. 11A and 11B. For example, on the second region 9120A, vias 9121_5A and 9121_6A are formed to be connected commonly to a seventh solder ball 9370A in order to apply the ground voltage Vss to the first type semiconductor chip 9100A, and vias 9122_5A and 9122_6A are formed to be connected commonly to a eighth solder ball 9380A in order to apply the ground voltage Vss to the second type semiconductor chip 9200A. Also, on the fourth region 9220A, vias 9221_5A and 9221_6A are formed to be aligned with the vias 9122_5A and 9122_6A, respectively, in order to apply the ground voltage Vss to the second type semiconductor chip 9200A.

The semiconductor package 9000A may be embodied in various ways, based on the above previous embodiments. For example, in the semiconductor package 9000A of FIG. 11D, the size of the first type semiconductor chip 9100A is equal to that of the second type semiconductor chip 9200A and the size of the second region 9120A of the first type semiconductor chip 9100A is equal to that of the fourth region 9220A of the second type semiconductor chip 9200A. Since the first type semiconductor chip 9100A may act a master chip of a NAND memory chip and the second type semiconductor chip 9200A may act as a master chip of a DRAM memory chip, the size of the second region 9120A may be equal to that of the fourth region 9220A. Also, in each of the second region 9120A and the fourth region 9220A, a peripheral circuit for a NAND memory operation and a peripheral circuit for a DRAM memory operation may be disposed.

FIGS. 12A to 12E illustrate other embodiments of a semiconductor package 9000B. In the embodiments of FIGS. 12A to 12E, a plurality of chips included in the semiconductor package 9000B include different types of memory cells, e.g., a volatile memory cell and a non-volatile memory cell.

Referring to FIGS. 12A to 12E, in one embodiment, the semiconductor package 9000B includes a first type semiconductor chip 9100B having a DRAM cell and a second type semiconductor chip 9200B having a NAND cell, and the size of the first type semiconductor chip 9100B is greater than that of the second type semiconductor chip 9200B. As described above, the size of the first type semiconductor chip 9100B may be the same as that of the second type semiconductor chip 9200B.

The first type semiconductor chip 9100A and the second type semiconductor chip 9200A may exchange some signals with an external memory controller (not shown) in different paths and may exchange other signals with the external memory controller in the same path. For example, if the first type semiconductor chip 9100B includes a NAND controller and a NAND interface unit for driving the NAND cell, the first type semiconductor chip 9100B and the second type semiconductor chip 9200A may exchange data signals with the external memory controller in the same path. However, a supply voltage Vdd and/or a ground voltage Vss may be applied to the first type semiconductor chip 9100B and the second type semiconductor chip 9200B in different paths. Further, the semiconductor package 9000B may include a molding unit 9305B for molding the semiconductor chips 9100B to 9200B and the package substrate 9300B.

Figure 12A:
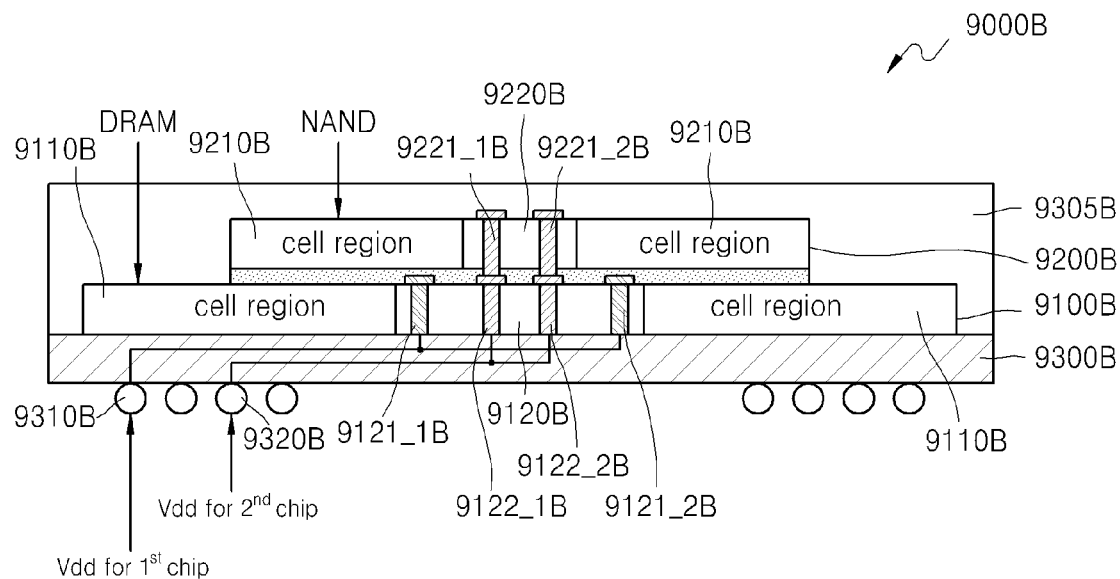
FIGS. 12A to 12E illustrate other exemplary embodiments of a semiconductor package.
Figure 12B:
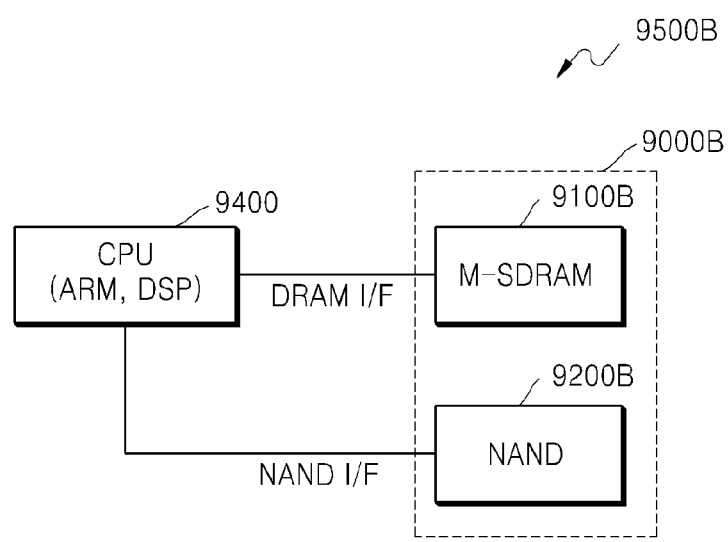

In detail, FIG. 12A illustrates an exemplary path in which the supply voltage Vdd is applied to the semiconductor package 9000B, according to one embodiment. The ground voltage Vss may be applied to the embodiment of FIG. 12A, instead of the supply voltage Vdd. Referring to FIG. 12A, the first type semiconductor chip 9100B may include a first region 9110B having a DRAM cell, and a second region 9120B on which a plurality of pads and a plurality of vias are disposed. On the second region 9120B, vias 9121_1B and 9121_2B are formed to apply the supply voltage Vdd to the first type semiconductor chip 9100B and vias 9122_1B and 9122_2B are formed to apply the supply voltage Vdd to the second type semiconductor chip 9200B. The vias 9121_1B and 9121_2B are connected commonly to the first solder ball 9310B and the vias 9122_1B and 9122_2B are connected commonly to the second solder ball 9320B. The second type semiconductor chip 9200B may further include a third region 9210B having a NAND cell, and a fourth region 9220B in which a plurality of pads and a plurality of vias are disposed. On the fourth region 9220B, via 9221_1B, 9221_2B are formed to be aligned with the vias 9122_1B and 9122_2B on the second region 9120B, respectively. FIG. 12B is a block diagram of a semiconductor memory system or semiconductor package module 9500B having the semiconductor package 9000B of FIG. 12A, according to one embodiment. A central processing unit (CPU) 9400 included in the semiconductor package module 9500B communicates with a first type semiconductor chip 9100B and a second type semiconductor chip 9200B of the semiconductor package 9000B in different paths, respectively.

Figure 12C:
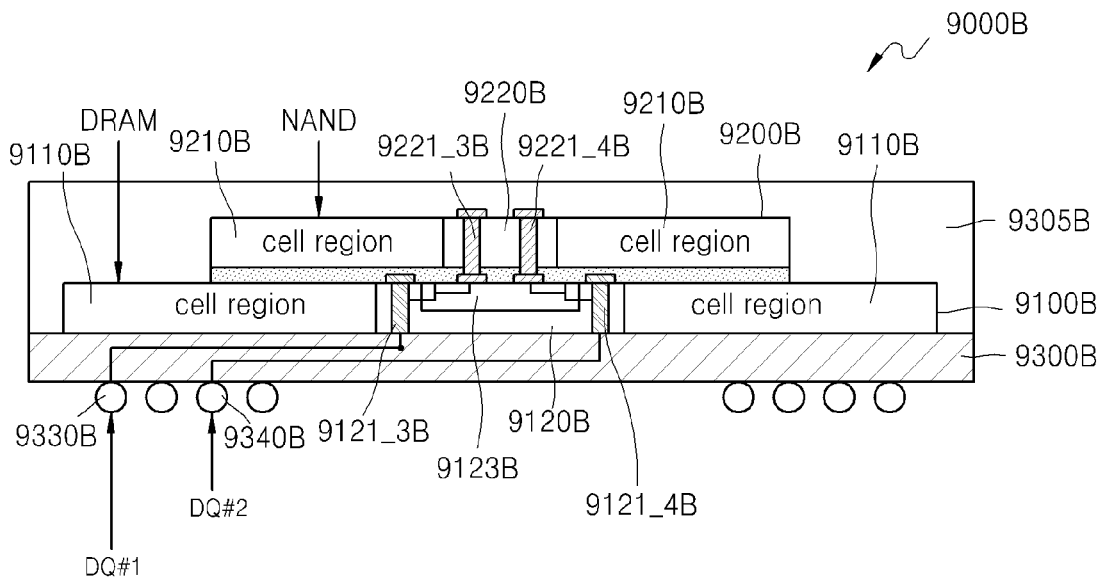

FIG. 12C is an exemplary cross-sectional view illustrating a signal path related to data input to and output from the semiconductor package 9000B, according to one embodiment. As described above, if the first type semiconductor chip 9100B includes a NAND controller and a NAND interface unit for driving a NAND cell, the first type semiconductor chip 9100B and the second type semiconductor chip 9200B may exchange data with an external memory controller in the same path. For example, on the second region 9120B of the first type semiconductor chip 9100B, vias 9121_3B and 9121_4B are formed to deliver data. The vias 9121_3B and 9121_4B are connected to third and fourth solder balls 9330B and 9340B, respectively. The vias 9121_3B and 9121_4B on the second region 9120B are connected to the vias 9221_3B and 9221_4B on the fourth region 9220B of second type semiconductor chip 9200B via a NAND driving unit 9123B, respectively. If the first type semiconductor chip 9100B is selected during a data input/output operation, data from the DRAM cell of the second region 9120B is communicated to the external memory controller via the vias 9121_3B and 9121_4B. If the second type semiconductor chip 9200B is selected during a data input/output operation, data from the NAND cell of the second type semiconductor chip 9200B is communicated to the external memory controller via the vias 9221_3B and 9221_4B on the fourth region 9220B, the NAND driving unit 9123B, and the vias 9121_3B and 9121_4B on the second region 9120B. Therefore, when the first type semiconductor chip 9100B is selected, the data from the DRAM cell is delivered via the third and fourth solder balls 9330B and 9340B, and when the second type semiconductor chip 9200B is selected, the data from the NAND cell is delivered via the third and fourth solder balls 9330B and 9340B.

Figure 12D:
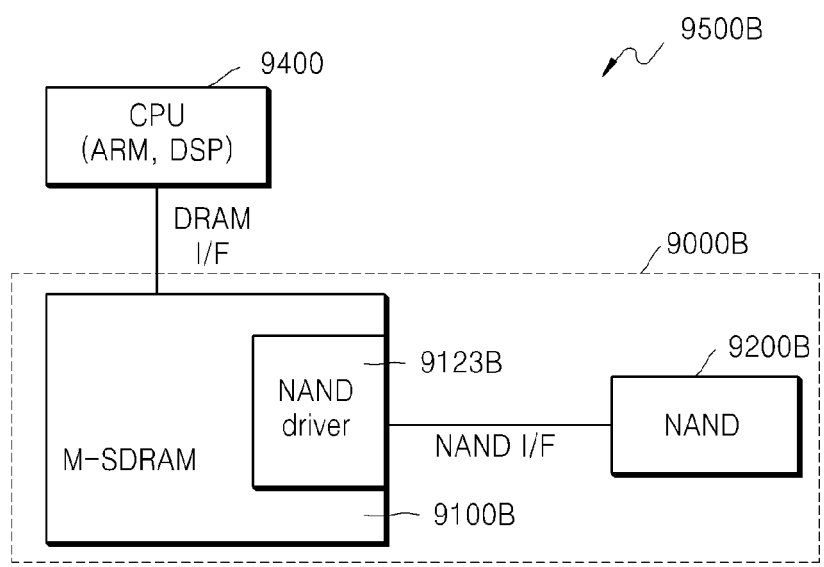

FIG. 12D is an exemplary block diagram of a semiconductor memory system or semiconductor package module 9500B having the semiconductor package 9000B of FIG. 12C, according to one embodiment. Referring to FIG. 12D, the semiconductor package 9000B includes the first type semiconductor chip 9100B and the second type semiconductor chip 9200B. The NAND driving unit 9123B that drives the second type semiconductor chip 9200B is included in the first type semiconductor chip 9100B. An embodiment of the NAND driving unit 9123B according to one embodiment will now be described with reference to FIG. 12E.

Figure 12E:
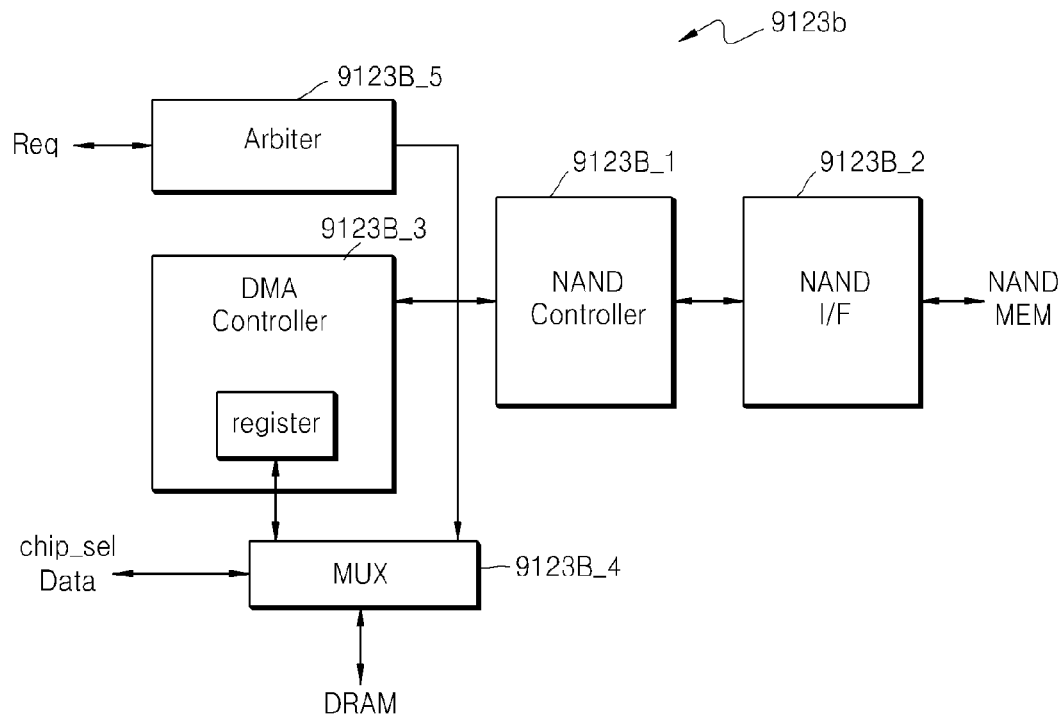

FIG. 12E is an exemplary block diagram of the NAND driving unit 9123B of FIG. 12D according to one embodiment. Referring to FIG. 12E, the NAND driving unit 9123B may include a NAND controller 9123B_1, a NAND interface unit 9123B_2, a direct memory access (DMA) controller 9123B_3, a multiplexer 9123B_4, and an arbiter 9123B_5. FIG. 12E illustrates that all these elements are included in the first type semiconductor chip 9100B but the disclosed embodiments are not limited thereto. In order to deliver data in the same path, some of these elements, e.g., the NAND interface unit 9123B_2, may be included in the first type semiconductor chip 9100B and the other elements may be included in the second type semiconductor chip 9200B.

The NAND controller 9123B_1 and the NAND interface unit 9123B_2 drive a NAND memory cell, and the DMA controller 9123B_3 controls accessing to a DRAM memory cell included in the first type semiconductor chip 9100B. The arbiter 9123B_5 controls exchange of data between an external processor (not shown) and the DMA controller 9123B_3, between the external memory controller and the DRAM memory cell, and between the DMA controller 9123B_3 and the DRAM memory cell. Also, the arbiter 9123B_5 generates a predetermined signal, in response to a request Req given from the external memory controller, and determines priority for data access in order to prevent a collision from occurring when data is transmitted.

The multiplexer 9123B_4 delivers data under control of the external memory controller and the DMA controller 9123B_3. For example, the multiplexer 9123B_4 transmits data to the external memory controller in response to a chip selection signal chip_sel received from the external memory controller. The DMA controller 9123B_3 includes a register to temporarily store data received from the NAND memory cell. The multiplexer 9123B_4 receives data from the DRAM memory cell, and data that is received from the NAND memory cell and is temporarily stored in the register, and selectively outputs either the data received from the DRAM memory cell or the data being temporarily stored in the register, in response to the chip selection signal chip_sel.

Figure 13:
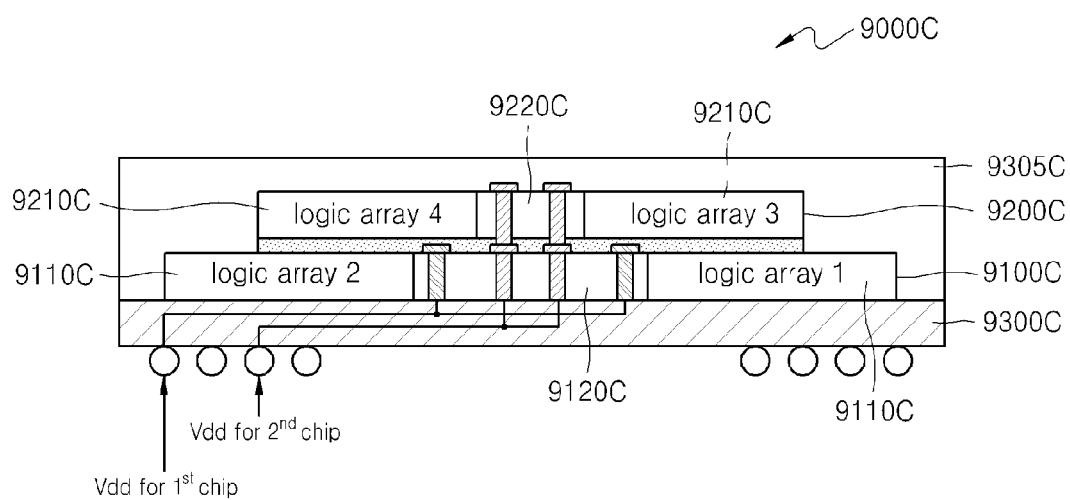
FIG. 13 is a block diagram of an exemplary semiconductor package according to one embodiment.

FIG. 13 is an exemplary block diagram of a semiconductor package 9000C according to one embodiment. FIG. 13 illustrates a case where each of a plurality of semiconductor chips includes a logic array instead of a memory cell unlike in the above previous embodiments. Referring to FIG. 13, the semiconductor package 9000C includes a first semiconductor chip 9100C, a second semiconductor chip 9200C, and a package substrate 9300C. The semiconductor package 9000C further includes a molding unit 9305C for molding the first and second semiconductor chips 9100C and 9200C and the package substrate 9300C.

Similar to the above previous embodiments, the first semiconductor chip 9100C includes a first region 9110C and a second region 9120C. The first region 9110C of the first semiconductor chip 9100C may include a logic array for performing a predetermined logic operation so that the semiconductor package 9000C may act as a logic package. On the second region 9120C, a plurality of vias and a plurality of pads may be disposed for signal transmission.

The second semiconductor chip 9200C further includes a third region 9120C and a fourth region 9220C. The third region 9120C may also include a logic array for performing a predetermined logic operation. On the fourth region 9220C, a plurality of vias and a plurality of pads may also be disposed for signal transmission. If the above previous embodiments are applied to the current embodiment of FIG. 13, then some of signals supplied to the semiconductor package 9000C may be supplied to the first and second semiconductor chips 9100C and 9200C in different paths and the other signals may be supplied to the first and second semiconductor chips 9100C and 9200C in a common path. Referring to FIG. 13, a supply voltage Vdd is applied to the first and second semiconductor chips 9100C and 9200C from the outside in different paths.

While different exemplary embodiments have been particularly shown and described herein, it will be understood that various changes in form and details may be made therein without departing from the spirit and scope of the following claims.

What is claimed is:

1. A memory module, comprising:
a first multichip package, the first multichip package including a first master chip and a first plurality of slave chips;
a second multichip package, the second multichip package including a second master chip and a second plurality of slave chips;
a first through via, the first through via passing through the first master chip and electrically connected to the first master chip to provide a supply voltage to the first master chip;
a second through via, the second through via passing through the first master chip without being electrically connected to provide a supply voltage to the first master chip;
a first set of additional through vias, each additional through via passing through a respective one of the first plurality of slave chips and electrically connected to the respective one of the first plurality of slave chips, wherein the second through via and first set of additional through vias are aligned to form a first stack of through vias;
a third through via, the third through via passing through the second master chip and electrically connected to the second master chip to provide the supply voltage to the second master chip;
a fourth through via, the fourth through via passing through the second master chip without being electrically connected to provide a supply voltage to the second master chip;
a second set of additional through vias, each additional through via passing through a respective one of the second plurality of slave chips and electrically connected to the respective one of the second plurality of slave chips, wherein the fourth through via and second set of additional through vias are aligned to form a second stack of through vias;

a first port electrically connected to the first and third through vias for providing the supply voltage to the first master chip and the second master chip; and a second port electrically connected to the first and second stacks of through vias for providing the supply voltage to the first plurality of slave chips and the second plurality of slave chips.

2. The memory module of claim 1, further comprising:

at least one memory cell region on each of the first master chip and the second master chip; and at least one memory cell region on each chip of the first plurality of slave chips and on each chip of the second plurality of slave chips.

3. The memory module of claim 2, wherein the at least one memory cell region on the first master chip includes two side portions, one on each side of the chip, and further comprising:

a central portion of the first master chip located between the two side portions, wherein each of the first through via and the second through via are located at the central portion.

4. The memory module of claim 1, wherein the first port is a separate port from the second port.

5. The memory module of claim 1, wherein the first port and the second port are the same port.

6. The memory module of claim 1, wherein the first through via provides a supply voltage to a first designated portion of a memory bank on the first master chip, and the first stack of through vias provides a supply voltage to the same first designated portion of memory banks on each of the first plurality of slave chips, and further comprising:

a fifth through via, the fifth through via passing through the first master chip and electrically connected to the first master chip to provide a supply voltage to the first master chip; and a set of sixth through vias, each of the sixth through vias passing through a respective one of the first plurality of slave chips and electrically connected to the respective one of the first plurality of slave chips, wherein the fifth through via and set of sixth through vias are aligned to form a third stack of through vias, and wherein the third stack of through vias provides a supply voltage to a second designated portion of a memory bank on both the first master chip and each chip of the first plurality of slave chips.

7. The memory module of claim 6, wherein the first designated portion of the memory bank is a memory cell array or a sense amplifier array, and the second designated portion of the memory bank is a row address decoder or a column address decoder.

8. The memory module of claim 1, further comprising:

a fifth through via, the fifth through via passing through the first master chip and electrically connected to the first master chip to provide a ground voltage to the first master chip;

a sixth through via, the sixth through via passing through the first master chip without being electrically connected to provide a ground voltage to the first master chip;

a third set of additional through vias, each additional through via passing through a respective one of the first plurality of slave chips and electrically connected to the respective one of the first plurality of slave chips, wherein the sixth through via and third set of additional through vias are aligned to form a third stack of through vias;

a seventh through via, the seventh through via passing through the second master chip and electrically connected to the second master chip to provide a ground voltage to the second master chip;

an eighth through via, the eighth through via passing through the second master chip without being electrically connected to provide a ground voltage to the second master chip;

a fourth set of additional through vias, each additional through via passing through a respective one of the second plurality of slave chips and electrically connected to the respective one of the second plurality of slave chips, wherein the eighth through via and fourth set of additional through vias are aligned to form a fourth stack of through vias.

9. The memory module of claim 1, further comprising:

a set of electrical signal paths, each electrical signal path of the set passing through all of the chips of a multichip package and electrically connected to each chip of the multichip package to supply either data or control signals to the respective chip.

10. The memory module of claim 9, wherein:

the electrical signal paths are not dedicated to a particular chip in a multichip package, the first stack of through vias comprises a first electrical voltage path that is dedicated to the first plurality of slave chips, and the second stack of through vias comprises a second electrical voltage path that is dedicated to the second plurality of slave chips.

11. The memory module of claim 1, wherein:

the master chips have a larger area than the slave chips.

12. The memory module of claim 1, wherein:

the master chips are have the same length and width as the slave chips.

13. A memory module, comprising:

a first multichip package, the first multichip package including a first substrate and a first stack of chips including a first chip and a plurality of second chips, wherein the first chip is located between the substrate and the plurality of second chips;

a second multichip package, the second multichip package including a second substrate and a second stack of chips including a first chip and a plurality of second chips, wherein the first chip is located between the substrate and the plurality of second chips;

a first electrical path in the first multichip package for providing a supply voltage to the first chip of the first stack of chips, the first electrical path comprising a first through via that passes through the first chip of the first stack of chips;

a second electrical path in the first multichip package for providing a supply voltage to the plurality of second chips of the first stack of chips, the second electrical path comprising a first stack of aligned through vias that pass through the first chip of the first stack of chips and the plurality of second chips of the first stack of chips, wherein the second electrical path is electrically isolated from the first chip of the first stack of chips;

a third electrical path in the second multichip package for providing a supply voltage to the first chip of the second stack of chips, the third electrical path comprising a second through via that passes through the first chip of the second stack of chips;

a fourth electrical path in the second multichip package for providing a supply voltage to the plurality of second chips of the second stack of chips, the fourth electrical path comprising a second stack of aligned through vias that pass through the first chip of the second stack of chips and the second chips of the first stack of chips, wherein the fourth electrical path is electrically isolated from the first chip of the second stack of chips;

a first port electrically connected to the first and third electrical paths for providing the supply voltage through the first and third electrical paths; and a second port electrically connected to the second and fourth electrical paths for providing the supply voltage through the second and fourth electrical paths.

14. The memory module of claim 13, wherein the first chip of the first stack of chips and the first chip of the second stack of chips are master chips, and the second chips of the first stack of chips and the second chips of the second stack of chips are slave chips.

15. The memory module of claim 13, wherein the first port is a separate port from the second port.

16. The memory module of claim 13, wherein the first port and the second port are the same port.

17. A module, comprising:
a first multichip package, the first multichip package including a first substrate and a first stack of chips including a first chip and a plurality of second chips, wherein the first chip is between the substrate and the plurality of second chips;

a second multichip package, the second multichip package including a second substrate and a second stack of chips including a first chip and a plurality of second chips, wherein the first chip is between the substrate and the plurality of second chips;

a first dedicated electrical path in the first multichip package for providing a supply voltage to the first chip of the first stack of chips, the first dedicated electrical path being dedicated to the first chip of the first stack of chip;

a second dedicated electrical path in the first multichip package for providing a supply voltage to the plurality of second chips of the first stack of chips, wherein the second dedicated electrical path is dedicated to the plurality of second chips of the first stack of chips and comprises a first set of through vias including a first through via passing through the first chip of the first stack of chips and a plurality of second through vias passing through the plurality of respective second chips of the first stack of chips, the first through via and plurality of second through vias aligned in a first through via stack;

a third dedicated electrical path in the second multichip package for providing a supply voltage to the first chip of the second stack of chips, the third dedicated electrical path being dedicated to the first chip of the second stack of chips;

a fourth dedicated electrical path in the second multichip package for providing a supply voltage to the plurality of second chips of the second stack of chips, wherein the fourth dedicated electrical path is dedicated to the plurality of second chips of the second stack of chips and comprises a second set of through vias including a third through via passing through the first chip of the second stack of chips and a plurality of fourth through vias passing through the plurality of respective second chips of the second stack of chips, the third through via and plurality of fourth through vias aligned in a second through via stack;

a first node electrically connected to the first and third dedicated electrical paths for providing a supply voltage to the first and third dedicated electrical paths; and a second node electrically connected to the second and fourth dedicated electrical paths for providing a supply voltage to the second and fourth dedicated electrical paths.

18. The module of claim 17, wherein the first node is a port of a controller and the second node is another port of a controller.

19. The module of claim 17, wherein the first node and the second node are the same node.

20. The module of claim 19, wherein the first node and the second node are a port of a controller.

21. The module of claim 17, further comprising:
a memory cell array on each of the chips of each multichip package; and a set of additional electrical paths, each additional electrical path of the set electrically connected to all chips of the multichip package to supply data to each chip of the multichip package.

22. The module of claim 17, wherein:
the first dedicated electrical path includes a first additional through via passing through the first chip of the first stack of chips;

the third dedicated electrical path includes a second additional through via passing through the first chip of the second stack of chips; and the first through via and first additional through via are located at a central portion of the first chip of the first stack of chips, and the third through via and second additional through via are located at a central portion of the first chip of the second stack of chips.

23. A multichip package, the multichip package including a substrate and a stack of chips including a first chip and a plurality of second chips, wherein the first chip is located between the substrate and the plurality of second chips;

a first electrical path in the multichip package for providing a first supply voltage to at least an addressing portion of the first chip;

a second electrical path in the multichip package for providing a second supply voltage to a data input/output unit of the first chip, so that the second electrical path is dedicated to the data input/output unit of the first chip such that the second electrical path is electrically isolated from the plurality of second chips; and a third electrical path in the first multichip package for providing a third supply voltage to the plurality of second chips of the stack of chips, the third electrical path comprising a stack of aligned through vias that pass through the first chip of the stack of chips and the plurality of second chips of the stack of chips, wherein the third electrical path is dedicated to the plurality of second chips such that the third electrical path is electrically isolated from the first chip.

24. The multichip package of claim 23, wherein the first and third supply voltages have a first voltage level, and the second supply voltage has a second, different, voltage level lower than the first voltage level.

* * * * *